United States Patent
Song et al.

(10) Patent No.: US 11,271,333 B2
(45) Date of Patent: Mar. 8, 2022

(54) TERMINAL MODULE

(71) Applicants: Dongguan Luxshare Technologies Co., Ltd, Dongguan (CN); HUAWEI TECHNOLOGIES CO., LTD., Shenzhen (CN)

(72) Inventors: Tao Song, Dongguan (CN); Kun Liu, Dongguan (CN); GuoDong Zhang, Shenzhen (CN); KaiDe Wang, Dongguan (CN); ZhenLiang Zhang, Dongguan (CN); Hang Yan, Shenzhen (CN)

(73) Assignees: Dongguan Luxshare Technologies Co., Ltd, Dongguan (CN); HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/102,439

(22) Filed: Nov. 24, 2020

(65) Prior Publication Data

US 2021/0167539 A1 Jun. 3, 2021

(30) Foreign Application Priority Data

Nov. 29, 2019 (CN) .......................... 201922107557.6
Nov. 29, 2019 (CN) .......................... 201922109138.6
Nov. 29, 2019 (CN) .......................... 201922109142.2

(51) Int. Cl.
*H01R 13/514* (2006.01)
*H01R 12/53* (2011.01)
(Continued)

(52) U.S. Cl.
CPC ........... *H01R 12/53* (2013.01); *H01R 12/515* (2013.01); *H01R 12/52* (2013.01); *H01R 12/585* (2013.01);
(Continued)

(58) Field of Classification Search
CPC ...... H01R 12/52; H01R 12/53; H01R 12/515; H01R 12/585; H01R 12/7005;
(Continued)

(56) References Cited

U.S. PATENT DOCUMENTS 3,707,696 A * 12/1972 Carter .................... H01R 12/78
439/248
6,162,099 A * 12/2000 Wu ......................... H01R 31/06
439/638

(Continued)

*Primary Examiner* — Khiem M Nguyen

(57) ABSTRACT

A terminal module, comprising a first cover, a first insulator, a second insulator, and a second cover. The first insulator is installed on the first cover, comprising a plurality of terminal bases and a plurality of first accommodating grooves. The plurality of terminal bases is disposed at the bottom of the first insulator. A terminal group is disposed in each of the terminal bases. The second insulator is disposed on the first insulator, comprising a plurality of second accommodating grooves. The plurality of second accommodating grooves correspond to the plurality of first accommodating grooves. Each of the first accommodating grooves and the corresponding second accommodating groove accommodate a cable collectively. The cable is electrically connected to the corresponding terminal group. The second cover is installed on the first insulator, so that the first insulator and the second insulator are disposed between the first cover and the second cover.

11 Claims, 20 Drawing Sheets

(51) Int. Cl.
| | |
|---|---|
| *H01R 12/52* | (2011.01) |
| *H01R 12/58* | (2011.01) |
| *H01R 12/51* | (2011.01) |
| *H01R 12/70* | (2011.01) |
| *H01R 12/71* | (2011.01) |
| *H01R 12/75* | (2011.01) |
| *H01R 13/502* | (2006.01) |
| *H01R 13/518* | (2006.01) |
| *H01R 13/6471* | (2011.01) |
| *H01R 13/40* | (2006.01) |
| *H05K 1/18* | (2006.01) |

(52) U.S. Cl.
CPC ..... *H01R 12/7005* (2013.01); *H01R 12/7064* (2013.01); *H01R 12/716* (2013.01); *H01R 12/75* (2013.01); *H01R 13/40* (2013.01); *H01R 13/502* (2013.01); *H01R 13/514* (2013.01); *H01R 13/518* (2013.01); *H01R 13/6471* (2013.01); *H05K 1/18* (2013.01)

(58) Field of Classification Search
CPC .. H01R 12/7064; H01R 12/716; H01R 12/75; H01R 13/40; H01R 13/502; H01R 13/514; H01R 13/518; H01R 13/6471; H05K 1/18
USPC .................................................. 439/83, 752
See application file for complete search history.

(56) References Cited

U.S. PATENT DOCUMENTS

| | | | |
|---|---|---|---|
| 2015/0311612 A1* | 10/2015 | Qiao | H01R 12/716 439/607.01 |
| 2019/0098778 A1* | 3/2019 | Pandey | H05K 5/0065 |
| 2020/0036124 A1* | 1/2020 | Tsai | H01R 12/716 |

* cited by examiner

TERMINAL MODULE

CROSS-REFERENCE TO RELATED APPLICATION

This application claims the priority benefit of Chinese Patent Applications Serial Number CN201922109138.6, CN201922109142.2, and CN201922107557.6 filed on Nov. 29, 2019, the full disclosure of which is incorporated herein by reference.

BACKGROUND

Technical Field

The present disclosure relates to the technical field of high-speed connectors, particularly to terminal module.

Related Art

Electrical connectors are widely used in various electronic equipment nowadays. As a part of electronic equipment, connectors are produced in various types and configurations according to applications for specific objects, frequencies, powers, and environments. For the industries of automotive, communication equipment, and consumer electronics, the demand for parts is increasingly relying on the development of miniaturization, high-speed and anti-interference, including interference caused by high-speed transmission, such as common electromagnetic interferences at the cable and the system (e.g., circuit board (PCB)), and electromagnetic interferences between the cable and the groundings.

The main function of the terminal module is to enable the cable to be connected to the circuit board through terminals to achieve the connection between the circuits. Common terminal modules would normally comprise components comprising housing, cable end terminals, and insulators. Since the insufficient strength of the structure, it is easy to be damaged during operation, how to make the terminal module to be electrically connected to the circuit board more efficiently and reliably are issues to be handled.

SUMMARY

The embodiments of the present disclosure provide a terminal module to solve the problem of insufficient structural strength of conventional terminal modules and the inability to optimize the signal transmission performance.

The present disclosure provides a terminal module, comprising a first cover, a first insulator, a second insulator, and a second cover. The first insulator is installed on the first cover, comprising a plurality of terminal bases and a plurality of first accommodating grooves. The plurality of terminal bases is disposed at the bottom of the first insulator. A terminal group is disposed in each of the terminal bases. The second insulator is disposed on the first insulator, comprising a plurality of second accommodating grooves. The plurality of second accommodating grooves correspond to the plurality of first accommodating grooves. Each of the first accommodating grooves and the corresponding second accommodating groove accommodate a cable collectively. The cable is electrically connected to the corresponding terminal group. The second cover is installed on the first insulator, so that the first insulator and the second insulator are disposed between the first cover and the second cover.

In the embodiments of the present disclosure, the first insulator and the second insulator accommodate the plurality of cables collectively by disposing the plurality of terminal groups on the first insulator to allow the plurality of cables to be connected to the plurality of terminal groups by soldering to form an electrical connection. When each of the cables is connected to each of the terminal groups having corresponding electrical property, independent spaces can be formed separately. Finally, the first insulator and the second insulator are disposed between the first cover and the second cover. Therefore, the structural strength can be improved, and signal interference can also be avoided.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
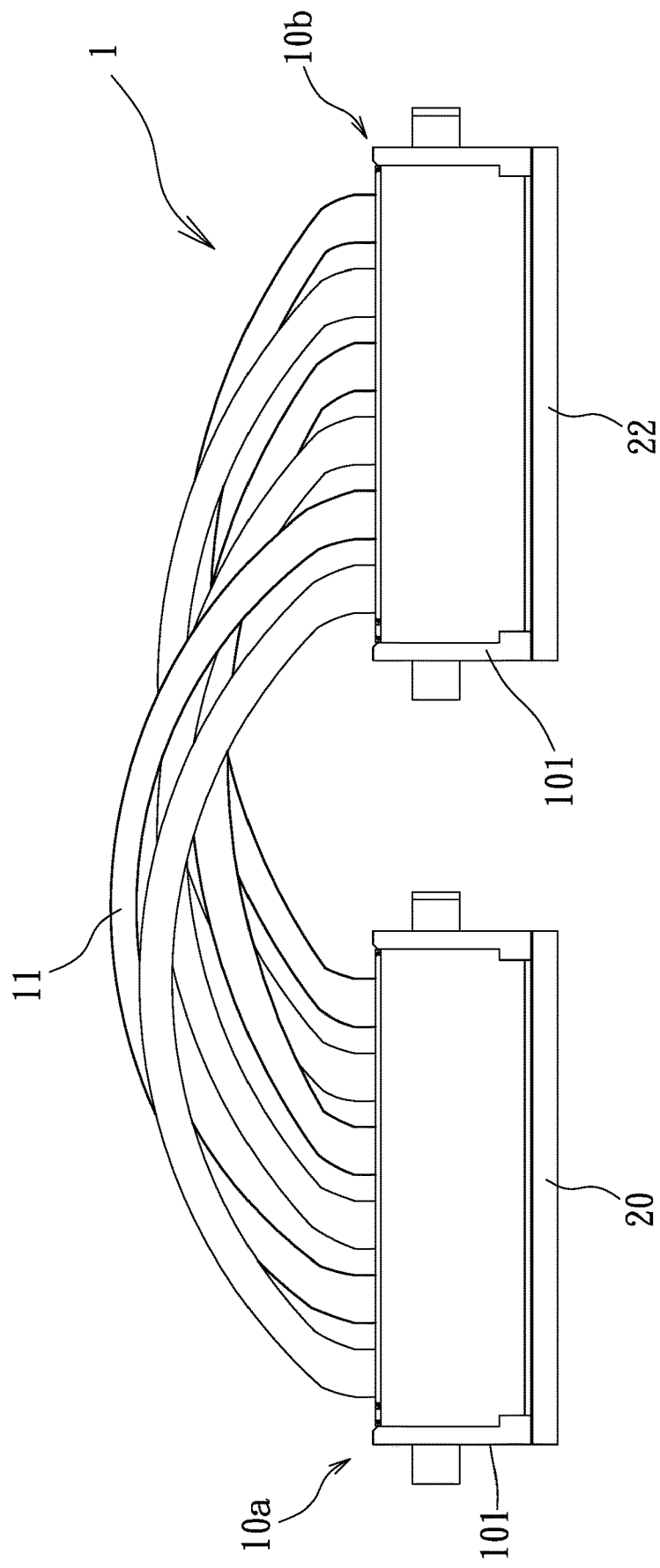
FIG. 1 is a schematic diagram of a cable connector of the first embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to member a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals are used to refer to the same or similar elements throughout the disclosure.

To improve the poor transmission performance of conventional connectors due to poor mating between male terminals and female terminals, a cable is used to directly connect two circuit boards of a cable connector of the present disclosure to improve the transmission performance. FIG. 1 to FIG. 6 are schematic diagram of a cable connector, perspective view of a first wire-to-board connector, schematic diagram of a terminal module installed in the housing, exploded view of the connection between the first wire-to-board connector and a first circuit board, perspective view of the connection between the first wire-to-board connector and a first circuit board, and perspective view of the connection between the terminal module and the first circuit board of the first embodiment of the present disclosure. As shown in the figure, a cable connector 1 connects with the circuit board, and comprises a first wire-to-board connector 10a, at least one second wire-to-board connector 10b, and a plurality of cables 11. In this embodiment, the first wire-to-board connector 10a and the second wire-to-board connector 10b are in a one-to-one corresponding configuration, which indicates that the number of the second wire-to-board connectors 10b is one. The first wire-to-board connector 10a and the second wire-to-board connector 10b respectively comprise a housing 101 and a plurality of terminal modules 102 (wafer). The first wire-to-board connector 10a connects to the second wire-to-board connector 10b correspondingly by the plurality of cables 11. The first wire-to-board connector 10a connects to a first circuit board 20, and the second wire-to-board connector 10b connects to a second circuit board 22. In this way, the first circuit board 20 can be electrically connected to the second circuit board 22. The two ends of each of the cables 11 are respectively connected to the corresponding terminal module 102 of the first wire-to-board connector 10a and the terminal module 102 of the second wire-to-board connector 10b. That is, the terminal module 102 of the first wire-to-board connector 10a can be regarded as a connector for connecting the cable 11 to the first circuit board 20, and the terminal module 102 of the second wire-to-board connector 10b can be regarded as a connector for connecting the cable 11 to the second circuit board 22. Then, the terminal module 102 of the first wire-to-board connector 10a connected to the cable 11 is disposed in the housing 101 of the first wire-to-board connector 10a to connect with the first circuit board 20, and the terminal module 102 of the second wire-to-board connector 10b connected to the cable 11 is disposed in the housing 101 of the second wire-to-board connector 10b to connect with the second circuit board 22. Both the housing 101 of the first wire-to-board connector 10a and the housing 101 of the second wire-to-board connector 10b could integrate the terminal modules 102, which facilitates the first wire-to-board connector 10a and the second wire-to-board connector 10b to be connected with the first circuit board 20 and the second circuit board 22, respectively.

In this embodiment, the first wire-to-board connector 10a and the second wire-to-board connector 10b are respectively connected to the first circuit board 20 and the second circuit board 22. The housing 101 of the first wire-to-board connector 10a is disposed on the first circuit board 20, and the plurality of terminal modules 102 of the first wire-to-board connector 10a is connected to the first circuit board 20. Similarly, the housing 101 of the second wire-to-board connector 10b is disposed on the second circuit board 22, and the plurality of terminal modules 102 of the second wire-to-board connector 10b is connected to the second circuit board 22. Two ends of each of the cables 11 are respectively connected to the first circuit board 20 and the second circuit board 22 through corresponding terminal modules 102, having the first circuit board 20 to be electrically connected to the second circuit board 22.

In this embodiment, the cable connector 1 is a connector that does not require multiple pluggings and unpluggings which is structurally stable, which can be applied to a transmission interface of Slim SAS, Serial Attached SCSI, or Small form-factor pluggable transceiver (SFP). The cable connector 1 of this embodiment uses a SATA compatible cable and a point-to-point serial transmission mode so that the installation program can be simply implemented in a computer system. The application of a high-speed server could also achieve demanding transmission performance through the cable connector 1 of this embodiment. The cable connector 1 of this embodiment is mainly in a wire-to-shield form having excellent attenuation performance, low delay performance, and anti-interference performance, to realize high-frequency broadband transmission to be performed in a variety of applications. The high-speed cables are well adapted for short-distance wiring in data centers with a wide range and strong integrated solution exchange capabilities. Thus, the cable 11 for connecting the first wire-to-board connector 10a with the second wire-to-board connector 10b is directly making the two circuit boards electrically connected, which is capable to solve the problems of poor signal transmission performance and poor signal shielding for conventional connectors.

Figure 2:
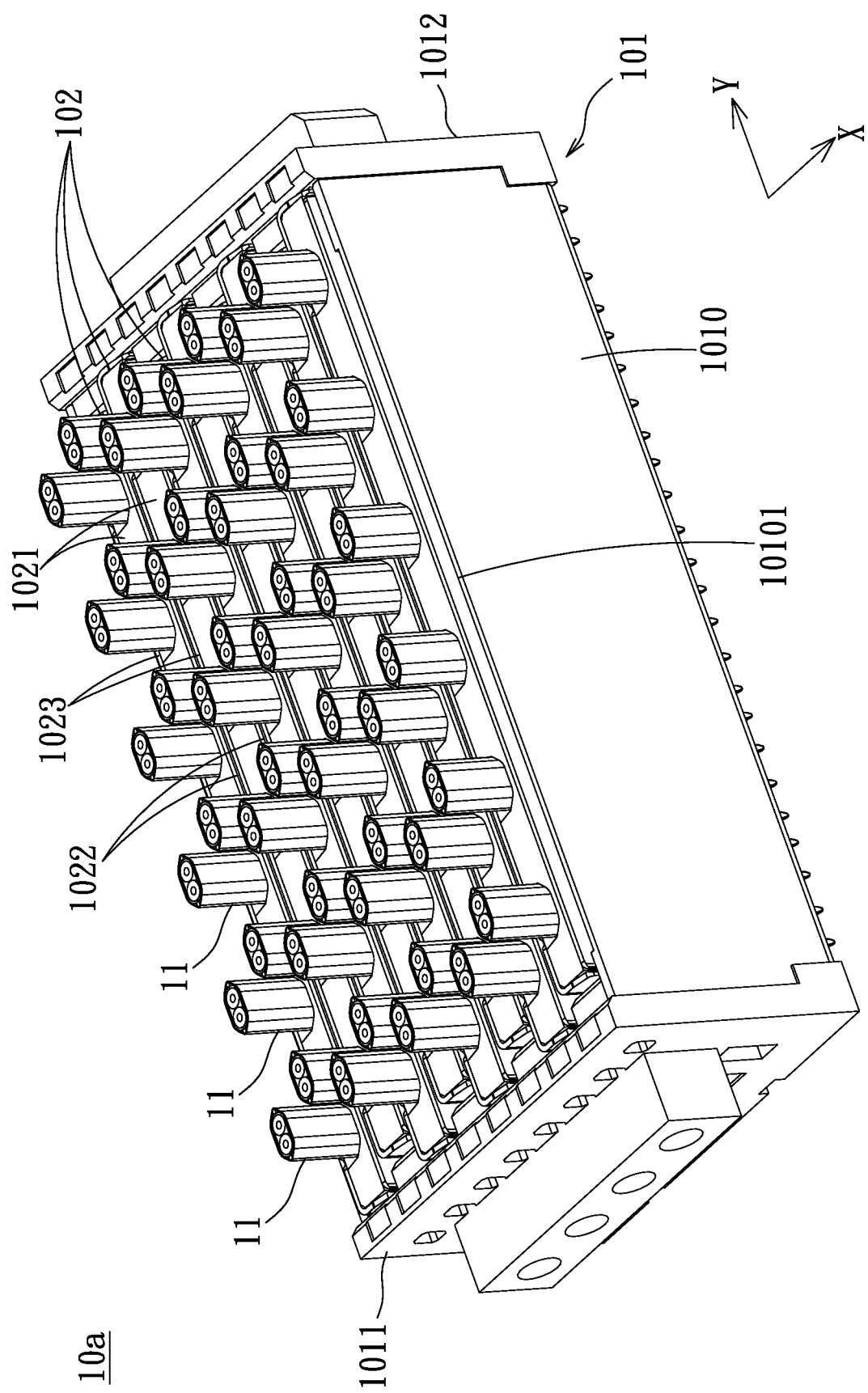
FIG. 2 is a perspective view of a first wire-to-board connector of the first embodiment of the present disclosure.

The configuration of the first wire-to-board connector 10a of this embodiment is identical to that of the second wire-to-board connector 10b so that only the first wire-to-board connector 10a would be described as follows. Refer to FIG. 2 and FIG. 3 again, and also refer to FIG. 7, FIG. 8, FIG. 9, FIG. 10, and FIG. 11, which are perspective view of the first wire-to-board connector, partial exploded view of the first wire-to-board connector, perspective view of the terminal module, and exploded views of the terminal module. As shown in the figures, the housing 101 comprises a main body 1010, comprising an accommodating groove 10101. The plurality of terminal modules 102 are disposed in parallel in the accommodating groove 10101 of the main body 1010 of the housing 101 along a first direction X, wherein adjacent two terminal modules 102 are closely disposed. Each of the terminal modules 102 comprises a sheet insulating body 1021, a first cover 1022, a second cover 1023, and a plurality of terminal groups 1024. In other words, the plurality of terminal modules 102 comprise a plurality of sheet insulating bodies 1021, a plurality of first covers 1022, and a plurality of second covers 1023. The plurality of sheet insulating bodies 1021, the plurality of first covers 1022, and the plurality of second covers 1023 are all disposed in parallel along the first direction X in the accommodating groove 10101. The first cover 1022 and the second cover 1023 of each of the terminal modules 102 cover the sheet insulating body 1021 at two opposite sides along the first direction X. This indicates that the first cover 1022 of each of the terminal modules 102 is adjacent to the second cover 1023 of the adjacent terminal module 102, and the second cover 1023 of each of the terminal modules 102 is adjacent to the first cover 1022 of the adjacent terminal module 102. The plurality of terminal groups 1024 of each of the terminal modules 102 are disposed in the sheet insulating body 1021 of the terminal module 102. The plurality of terminal groups 1024 are disposed along a second direction Y, which is perpendicular to the first direction X. The plurality of cables 11 are respectively connected to a corresponding terminal group 1024, and each of the terminal groups 1024 comprises a plurality of terminals disposed at intervals.

Figure 3:
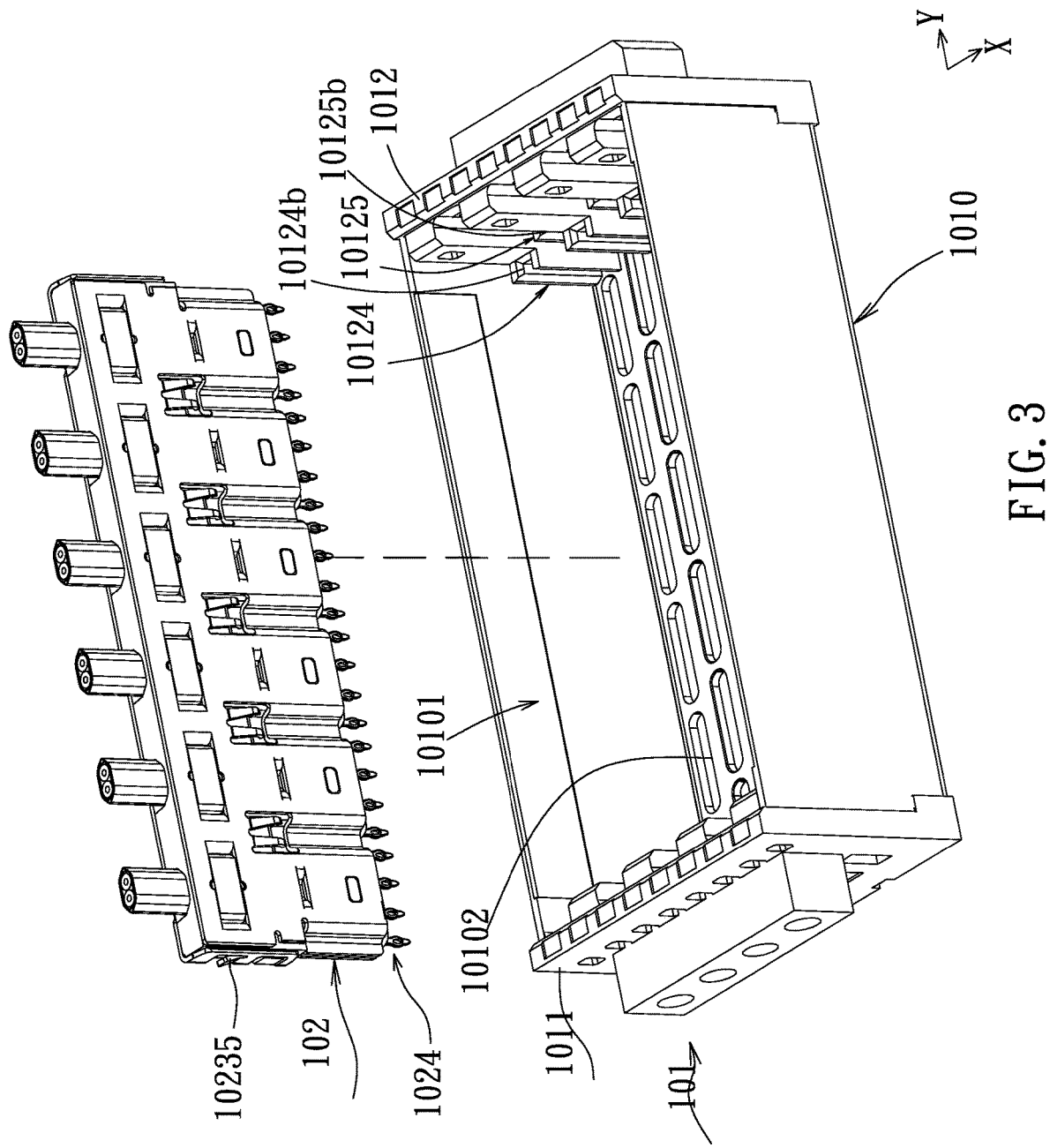
FIG. 3 is a schematic diagram of a terminal module installed in the housing of the first embodiment of the present disclosure.
Figure 4:
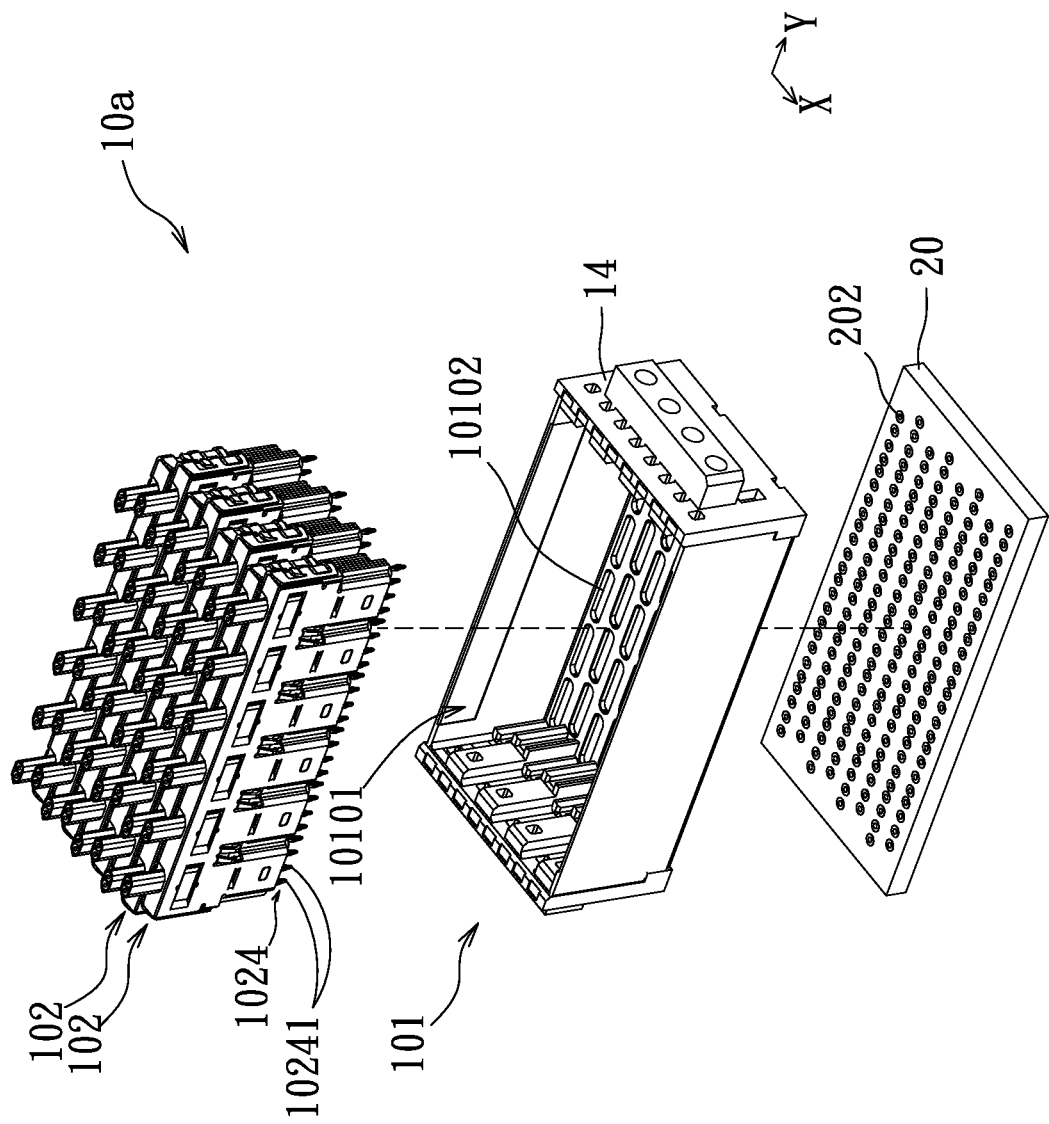
FIG. 4 is an exploded view of the connection between the first wire-to-board connector and a first circuit board of the first embodiment of the present disclosure.
Figure 5:
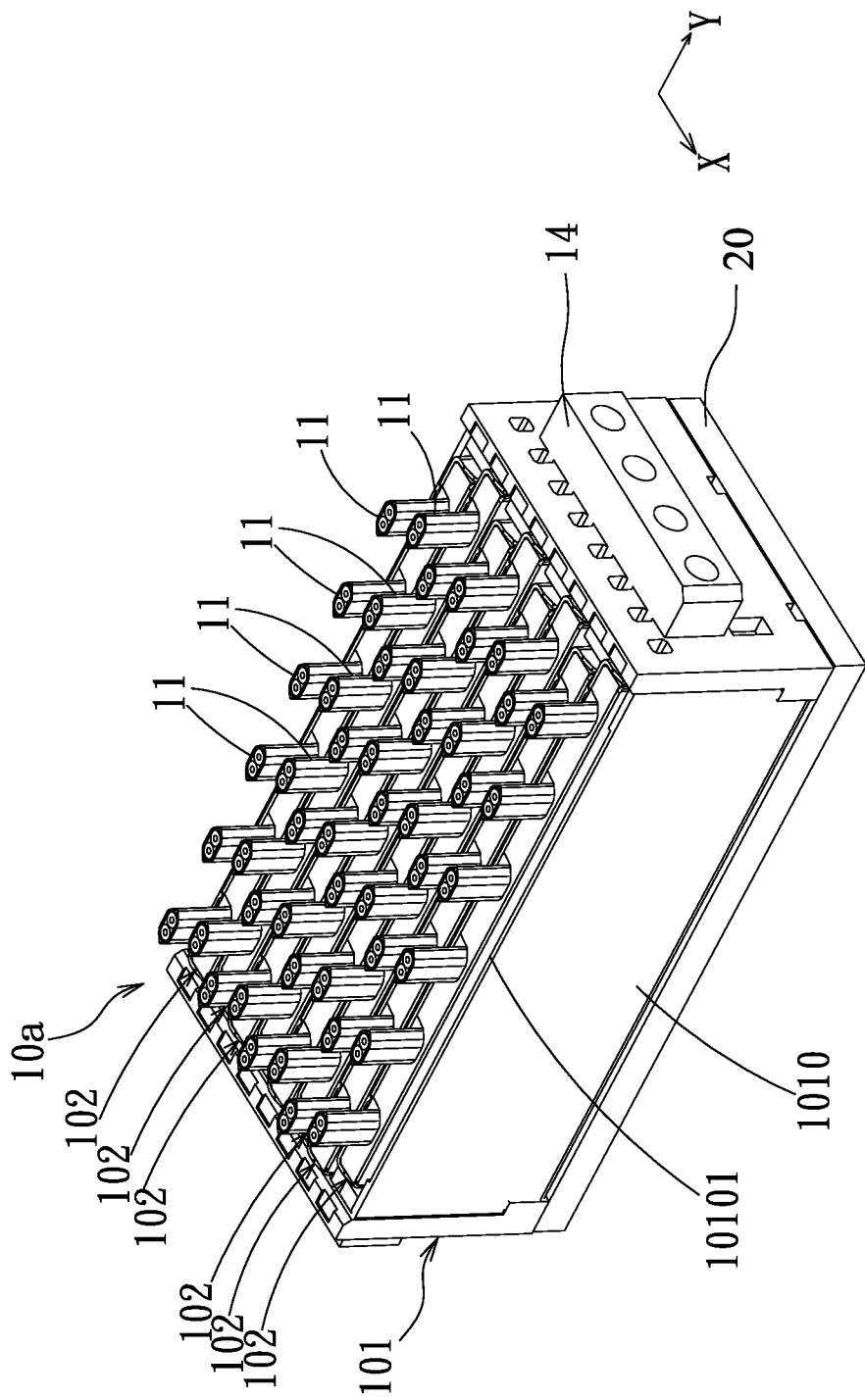
FIG. 5 is a perspective view of the connection between the first wire-to-board connector and a first circuit board of the first embodiment of the present disclosure.
Figure 6:
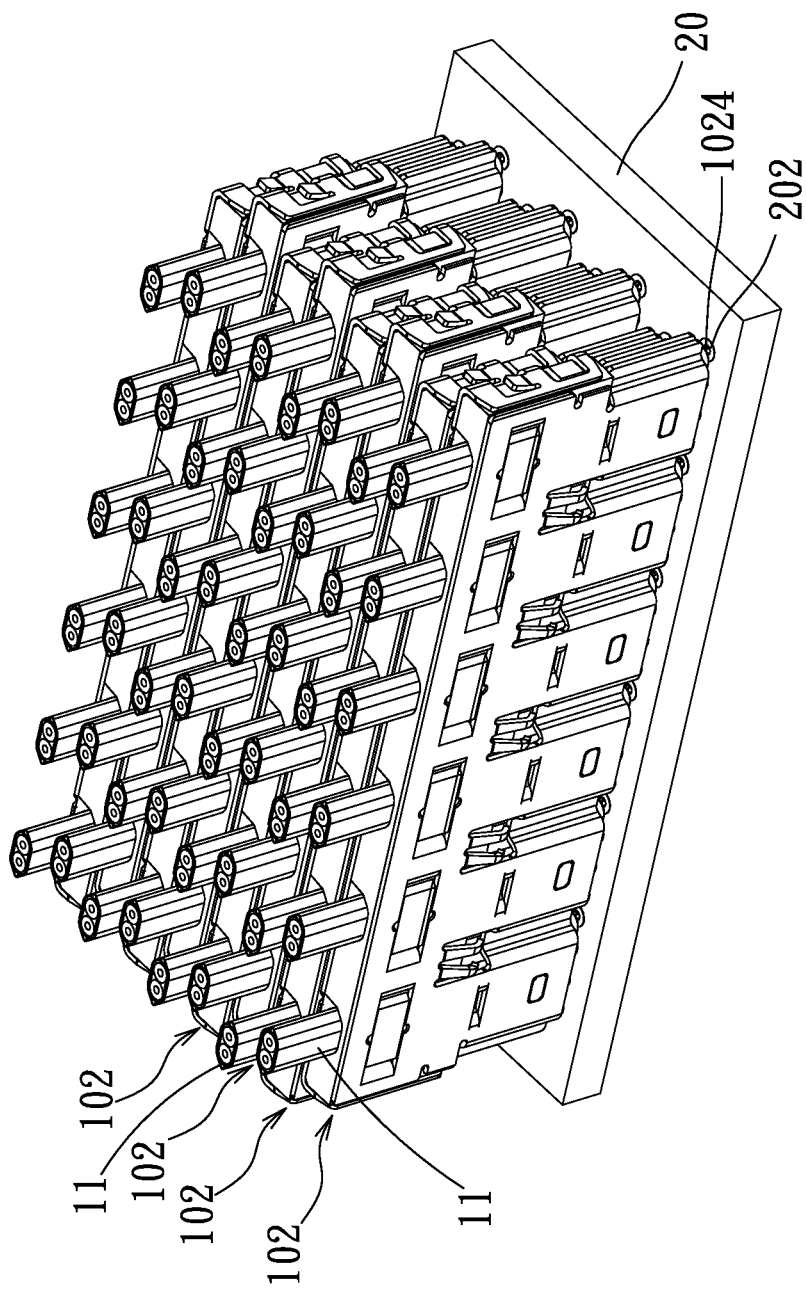
FIG. 6 is a perspective view of the connection between the terminal module and the first circuit board of the first embodiment of the present disclosure.
Figure 7:
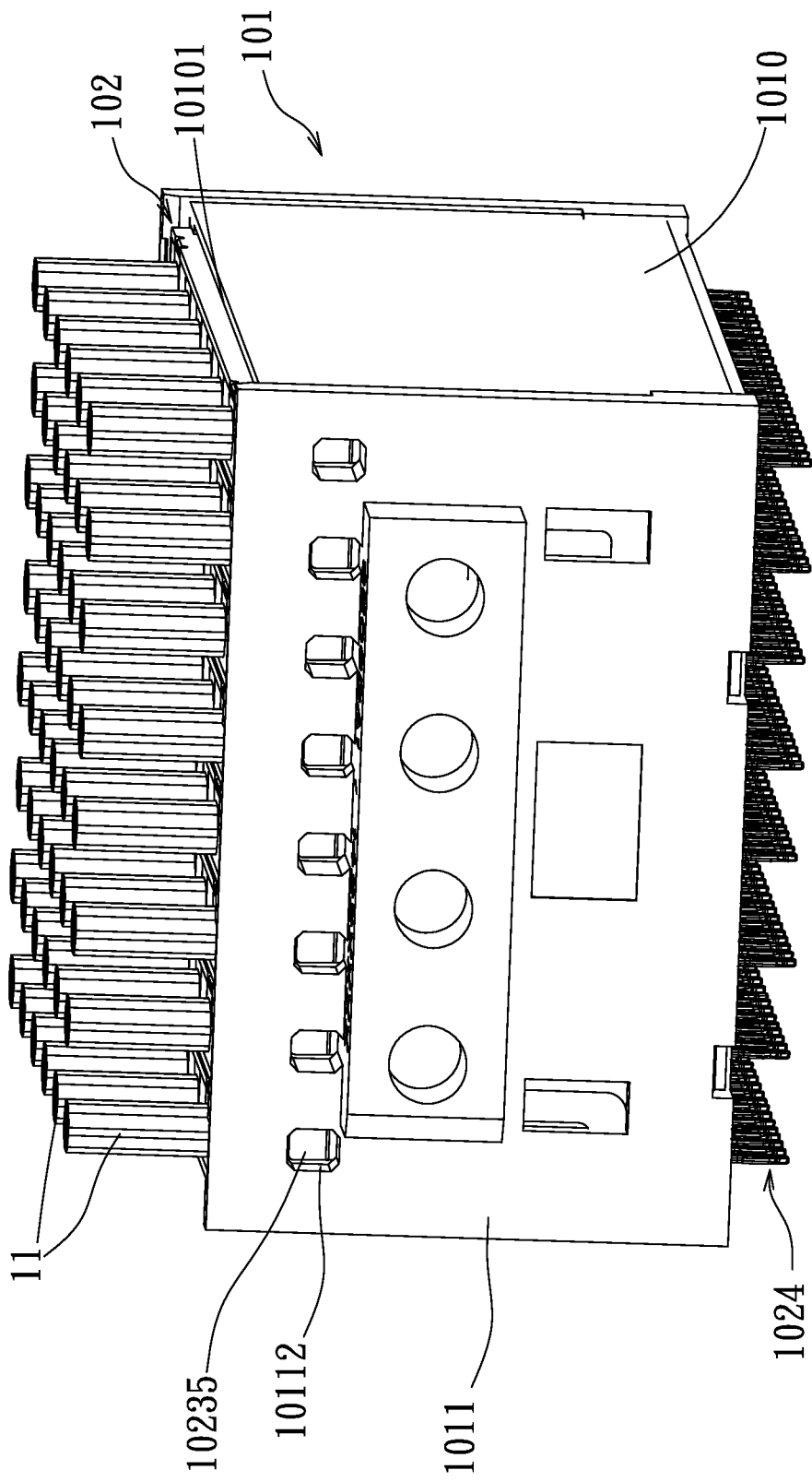
FIG. 7 is another perspective view of the first wire-to-board connector of the first embodiment of the present disclosure.
Figure 8:
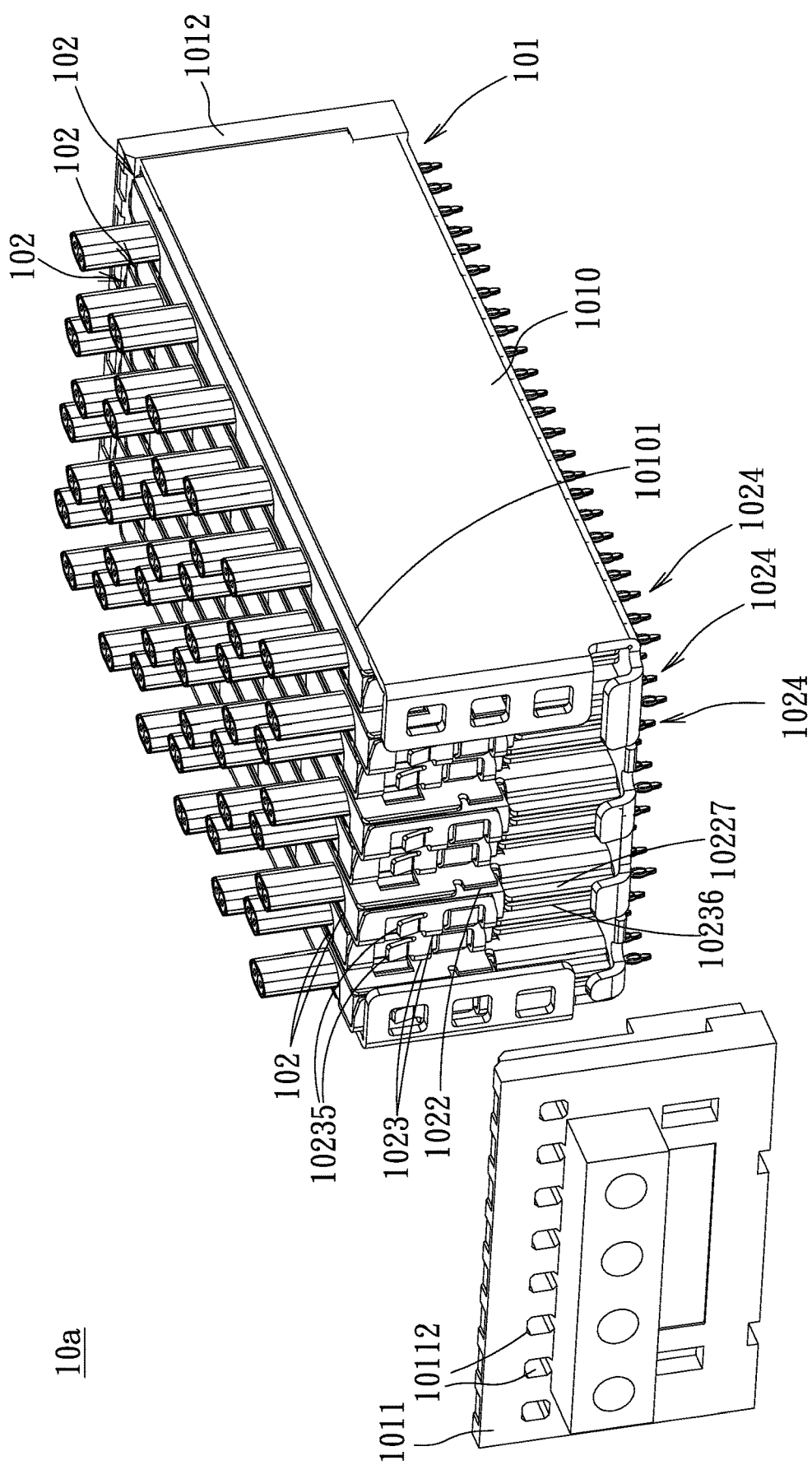
FIG. 8 is a partially exploded view of the first wire-to-board connector of the first embodiment of the present disclosure.
Figure 12:
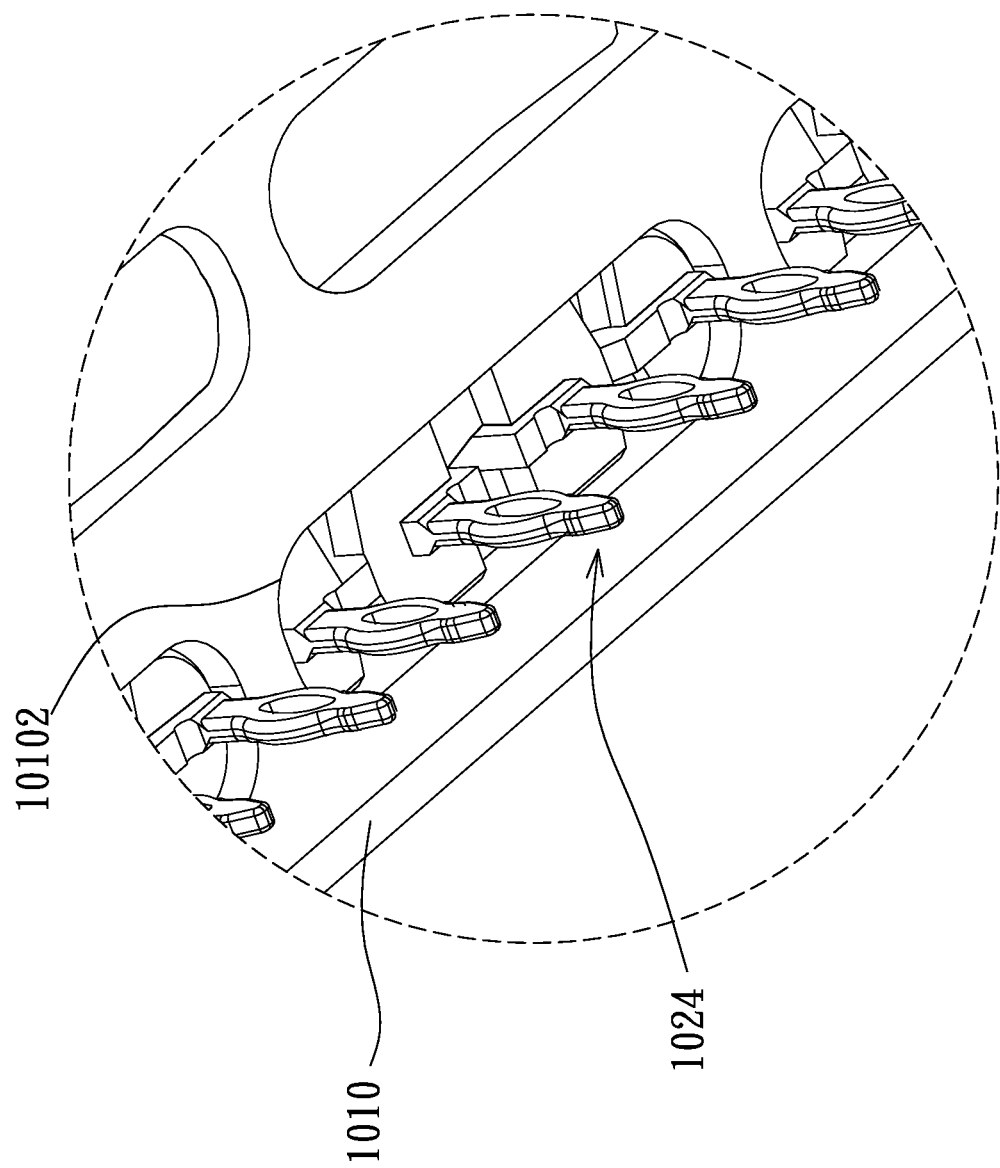
FIG. 12 is a partial schematic diagram of the terminal group installed on the housing of the first embodiment of the present disclosure.

The bottom of the accommodating groove 10101 of the main body 1010 of the housing 101 also comprises a plurality of terminal openings 10102 disposed at intervals (shown in FIG. 3 and FIG. 4). The plurality of terminal openings 10102 could match the position of each of the terminal groups 1024 of the plurality of terminal modules 102 of the first wire-to-board connector 10a. In this embodiment, each of the terminal openings 10102 is a longitudinal-shaped opening. Refer to FIG. 12, a partial schematic diagram of the terminal group installed on the housing of the first embodiment of the present disclosure. As shown in the figure, when the plurality of cables 11 are connected to a plurality of terminal groups 1024 of the plurality of terminal modules 102 of the first wire-to-board connector 10a, the plurality of terminal modules 102 are installed in the accommodating groove 10101 of the main body 1010 of the housing 101, each of the terminal groups 1024 correspondingly passes through the corresponding terminal opening 10102, and finally, the plurality of terminals of the plurality of terminal groups 1024 respectively pass through the corresponding terminal openings 10102 and are inserted onto the first circuit board 20. The cable 11 is electrically connected to the first circuit board 20 through the plurality of terminal groups 1024. In this embodiment, the plurality of terminals is vertically connected to the first circuit board 20. The diameter of each of the terminal openings 10102 could match the size of each of the terminal groups 1024, so that the plurality of terminals could be inserted into the terminal openings 10102 correspondingly. The first circuit board 20 of this embodiment comprises a plurality of conductive holes 202, each of which is correspondingly configured with one terminal of a terminal group 1024. In detail, each of the terminals comprises a contacting part 10241 and an electrical connecting part 10242. The contacting part 10241 is connected to the cable 11, and the electrical connecting part 10242 is connected to the first circuit board 20. The connecting process of the electrical connecting part 10242 to the first circuit board 20 is going to be described herein. In this embodiment, the electrical connecting part 10242 of each of the terminals is correspondingly inserted into each of the conductive holes 202 in a press-fitting manner to form an electrical connection. The electrical connecting part 10242 of each of the terminals comprises a fisheye component used by the electrical connecting part 10242 of each of the terminals to be press-fitted into the conductive hole 202 of the first circuit board 20. The fisheye component comprises two elastic parts elastically contracted when under squeezing, so that the related structure is deformed during the press-fitting process. Thus, the electrical connecting part 10242 of each of the terminals could be smoothly inserted into the conductive hole 202 of the first circuit board 20 through the fisheye component. When the fisheye component passes through the corresponding conductive hole 202, the two elastic parts of the fisheye component would abut against the conductive hole 202 of the first circuit board 20 to effectively prevent the electrical connecting part 10242 of each of the terminals from detaching from the first circuit board 20, and further ensure a firm connection between the terminals and the circuit board in low ohmic resistance. Besides, the fisheye component can be installed on the first circuit board 20 with only a slight pressing force, so that the terminal having the fisheye component could be easily installed onto the first circuit board 20. That is, the connection process between the terminal and the first circuit board 20 does not require any soldering. Thus, the terminal having the fisheye component is detachable to match smaller conductive holes 202 of the first circuit board 20. For example, the distance between adjacent conductive holes 202 can be extremely short and the diameter of the hole aperture can be extremely small (for example, the diameter of the press-fitting hole is about 14 mil). There are still many ways to connect the plurality of terminals of the plurality of terminal groups 1024 to the first circuit board 20, such as surface mount technology (SMT) or soldering. Thus, how the plurality of terminal groups 1024 are connected to the first circuit board 20 would not be limited herein. Since the structural configuration of the first wire-to-board connector 10a is identical to that of the second wire-to-board connector 10b, and the structural configuration of the second circuit board 22 is identical to that of the first circuit board 20, the assembly method for the second wire-to-board connector 10b with the second circuit board 22 is identical to that for the first circuit board 20 with the first wire-to-board connector 10a. The method for assembling the second wire-to-board connector 10b with the second circuit board 22 would not be described herein.

In this embodiment, the structural configuration of the terminal module 102 of the first wire-to-board connector 10a is identical to the terminal module 102 of the second wire-to-board connector 10b, which are both connected to corresponding circuit boards by press-fitting. The terminal module 102 of the first wire-to-board connector 10a and the terminal module 102 of the second wire-to-board connector 10b can also be connected with corresponding circuit boards by surface mount technology (SMT) or soldering.

The structural configuration of each of the terminal modules 102 in the first wire-to-board connector 10a or the second wire-to-board connector 10b is described as follows. In this embodiment, the terminal module 102 solves the problem of insufficient structural strength and poor performance of conventional terminal modules by providing comprehensive designing and improvements for the structural strength, assembly efficiency, and signal transmission performance for the terminal module 102. Back to FIG. 10 and FIG. 11, the sheet insulating body 1021 of the terminal module 102 comprises a first insulator 1021a and a second insulator 1021b connected to the first insulator 1021a. The first insulator 1021a comprises a plurality of first accommodating grooves 10212a disposed on a surface of the first insulator 1021a away from the first cover 1022 along the second direction Y. The plurality of terminal groups 1024 are disposed on the first insulator 1021a along the second direction Y, and protrude from the bottom of the first insulator 1021a. The plurality of terminal groups 1024 respectively correspond to the plurality of first accommodating grooves 10212a.

Figure 9:
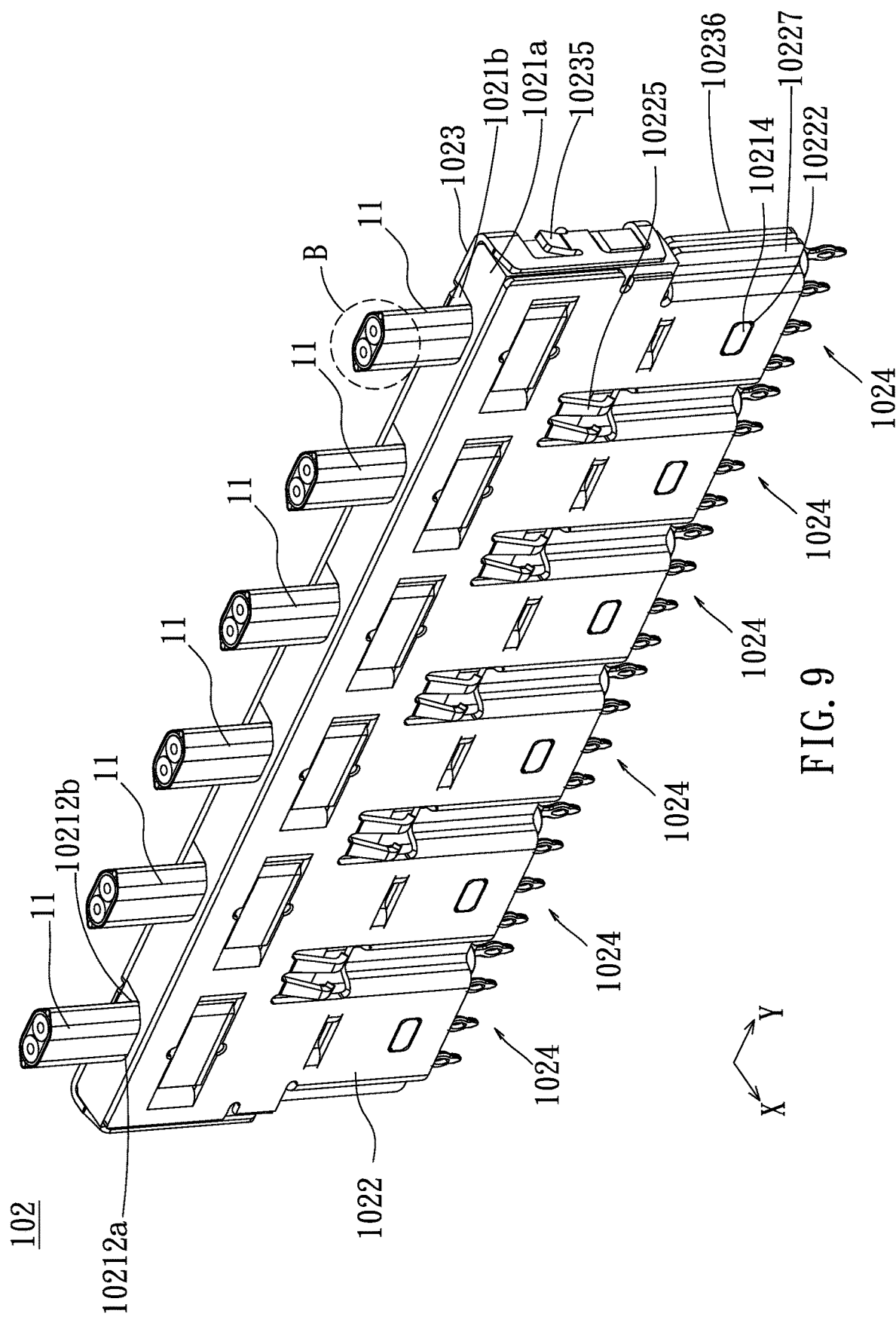
FIG. 9 is a perspective view of the terminal module of the first embodiment of the present disclosure.
Figure 10:
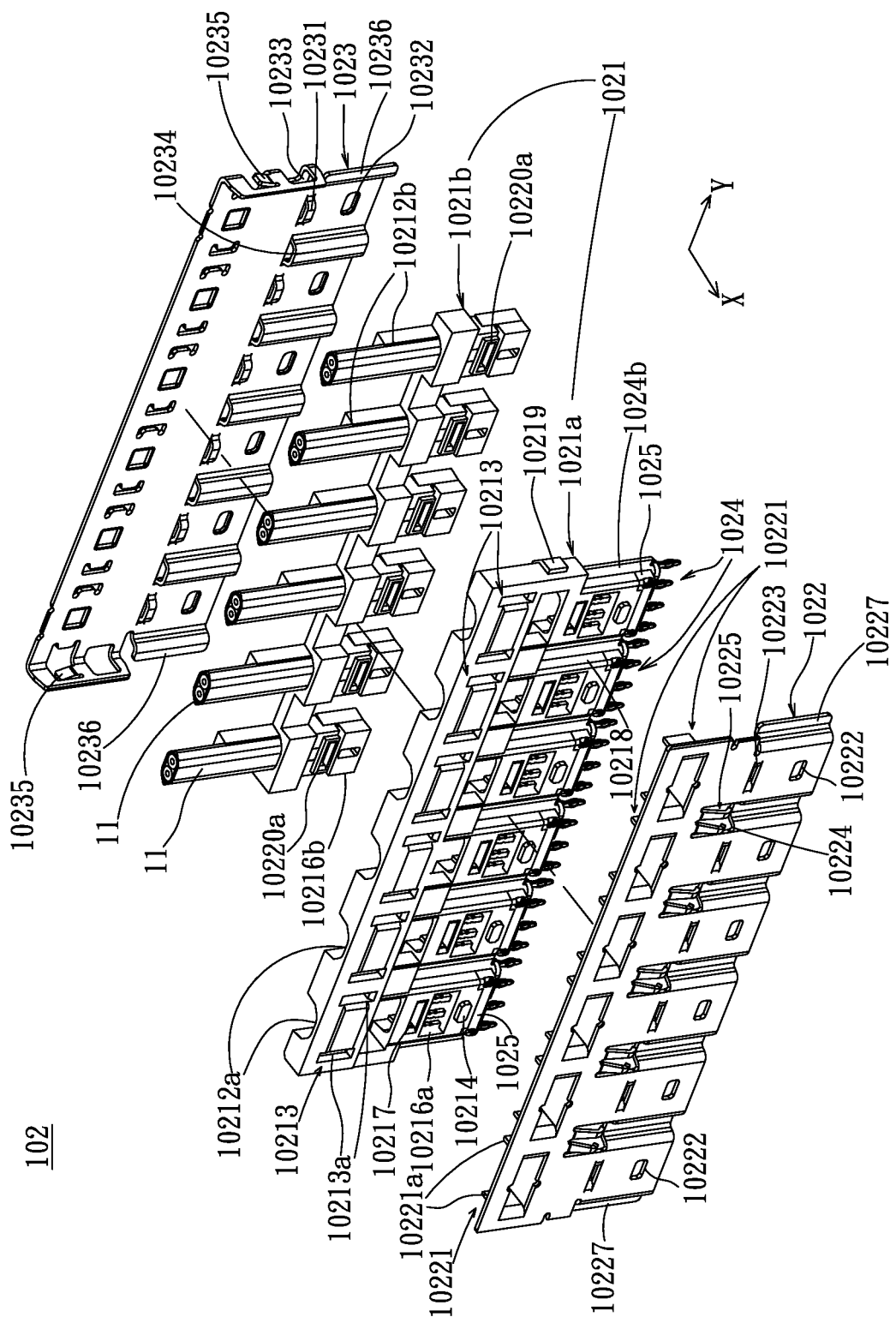
FIG. 10 is an exploded view of the terminal module of the first embodiment of the present disclosure.
Figure 11:
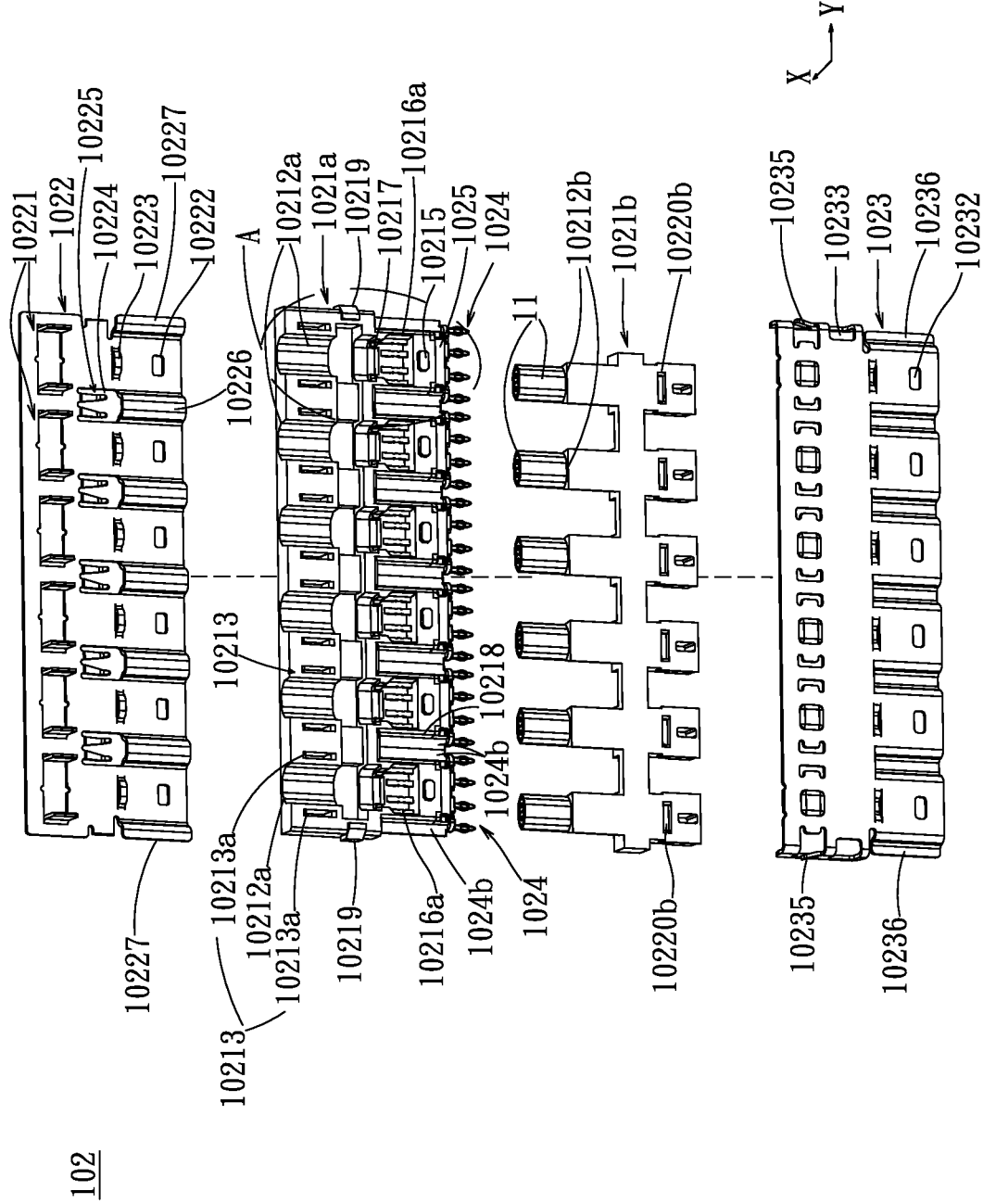
FIG. 11 is another exploded view of the terminal module of the first embodiment of the present disclosure.

The second insulator 1021b comprises a plurality of second accommodating grooves 10212b, and the plurality of second accommodating grooves 10212b are disposed along the second direction Y and are corresponding to the plurality of first accommodating grooves 10212a. The plurality of cables 11 are connected to the second insulator 1021b. Each of the cables 11 is disposed in the corresponding second accommodating groove 10212b. When the second insulator 1021b is connected to the first insulator 1021a, each of the first accommodating grooves 10212a is connected to the corresponding second accommodating groove 10212b, and the first accommodating groove 10212a and the second accommodating groove 10212b accommodate one cable 11 (as shown in FIG. 9) together. Since the first accommodating groove 10212a and the second accommodating groove 10212b are designed to match the appearance of the cable 11, the plurality of first accommodating grooves 10212a match with the plurality of second accommodating grooves 10212b. For example, the first accommodating groove 10212a and the second accommodating groove 10212b are both half-arc grooves, so an accommodating groove with an annular wall can be formed when the first accommodating groove 10212a is connected the second accommodating groove 10212b. Thus, the accommodating groove covers a part of the cable 11, and the cable 11 is electrically connected to the corresponding terminal group 1024.

Regarding the assembly of the terminal module 102, it is first to install the first insulator 1021a on the first cover 1022. Then the second insulator 1021b is installed on the first insulator 1021a, and the second cover 1023 is installed on the first insulator 1021a. In this way, the first insulator 1021a and the second insulator 1021b are disposed between the first cover 1022 and the second cover 1023.

The detailed structural configuration and assembly process of the first cover 1022, the first insulator 1021a, the second insulator 1021b, and the second cover 1023 would be described as follows. The first cover 1022 comprises a plurality of tenon components 10221, a plurality of first securing holes 10222, a plurality of first positioning parts 10223, a plurality of openings 10224, and a plurality of elastic piece groups 10225. The plurality of tenon components 10221 are disposed along the second direction Y, and are disposed on a surface of the first cover 1022 close to the first insulator 1021a. Each of the tenon components 10221 comprises two tenons 10221a symmetrically disposed. The plurality of first securing holes 10222 pass through the first cover 1022, and are respectively disposed below the corresponding tenon component 10221. Each of the first securing holes 10222 is disposed between two tenons 10221a of the corresponding tenon component 10221. Each of the first positioning parts 10223 protrudes from a surface of the first cover 1022 close to the first insulator 1021a along the first direction X, and is disposed between the tenon component 10221 and the first securing hole 10222 corresponding to the tenon component 10221. Each of the openings 10224 is disposed on a surface of the first cover 1022 away from the first insulator 1021a, and is disposed between two adjacent tenon components 10221. Each of the elastic piece groups 10225 is respectively disposed in the corresponding opening 10224. The elastic piece group 10225 of this embodiment comprises two elastic sheets disposed at intervals with lead angles.

The first insulator 1021a comprises a plurality of engaging parts 10213, a plurality of first securing blocks 10214, a plurality of second securing blocks 10215, a plurality of first limiting parts 10216a, a plurality of through holes 10217, a plurality of embedding openings 10218, and two blocks 10219. The plurality of engaging parts 10213 are disposed along the second direction Y, and respectively correspond to the plurality of first accommodating grooves 10212a. In this embodiment, each of the engaging parts 10213 comprises two symmetrical engaging holes 10213a. The two engaging holes 10213a penetrate the first insulator 1021a along the first direction X and are disposed on two sides of the first accommodating groove 10212a. The plurality of first securing blocks 10214 are disposed on a surface of the first insulator 1021a close to the first cover 1022 along the second direction Y, and are respectively disposed below the corresponding engaging parts 10213. The plurality of second securing blocks 10215 are disposed on a surface of the first insulator 1021a away from the first cover 1022 along the second direction Y. The plurality of second securing blocks 10215 are respectively disposed opposite to the plurality of first securing blocks 10214, which indicates that each of the second securing blocks 10215 and the first securing block 10214 corresponding to the second securing block 10215 are disposed along the first direction X, and are disposed below the corresponding engaging parts 10213. Each of the first limiting parts 10216a is disposed between the engaging part 10213 and the first securing block 10214 corresponding to the engaging part 10213 and is disposed on the first insulator 1021a along the first direction X. In this embodiment, the first limiting part 10216a is a through hole. Each of the through holes 10217 is disposed between the engaging part 10213 and the first limiting part 10216a corresponding to the engaging part 10213 and penetrates the first insulator 1021a along the first direction X. Each of the embedding openings 10218 is disposed between two adjacent engaging parts 10213. The two blocks 10219 are disposed on two sides of the first insulator 1021a.

Figure 13:
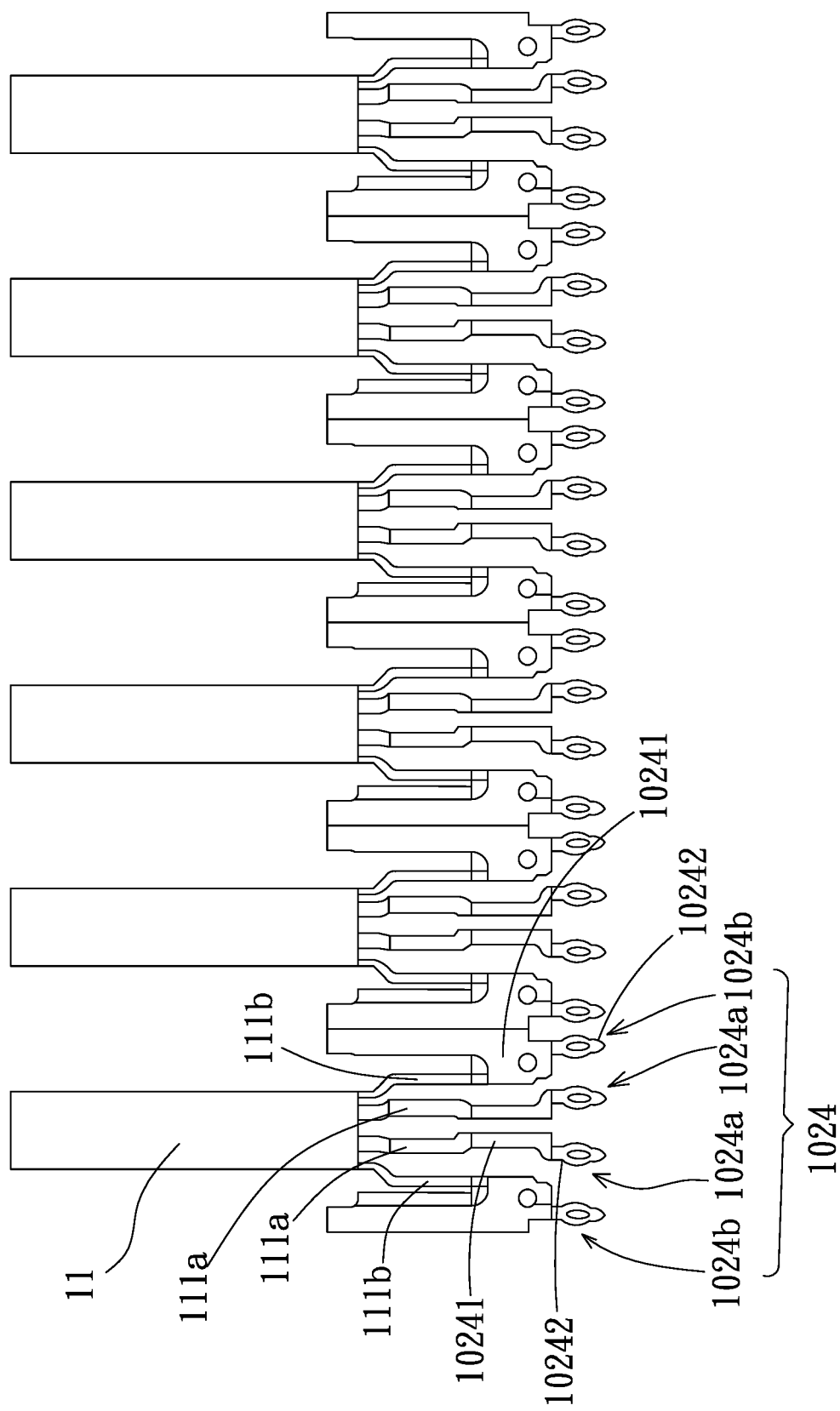
FIG. 13 is a schematic diagram of the connection between the terminal group and the cable of the first embodiment of the present disclosure.
Figure 14:
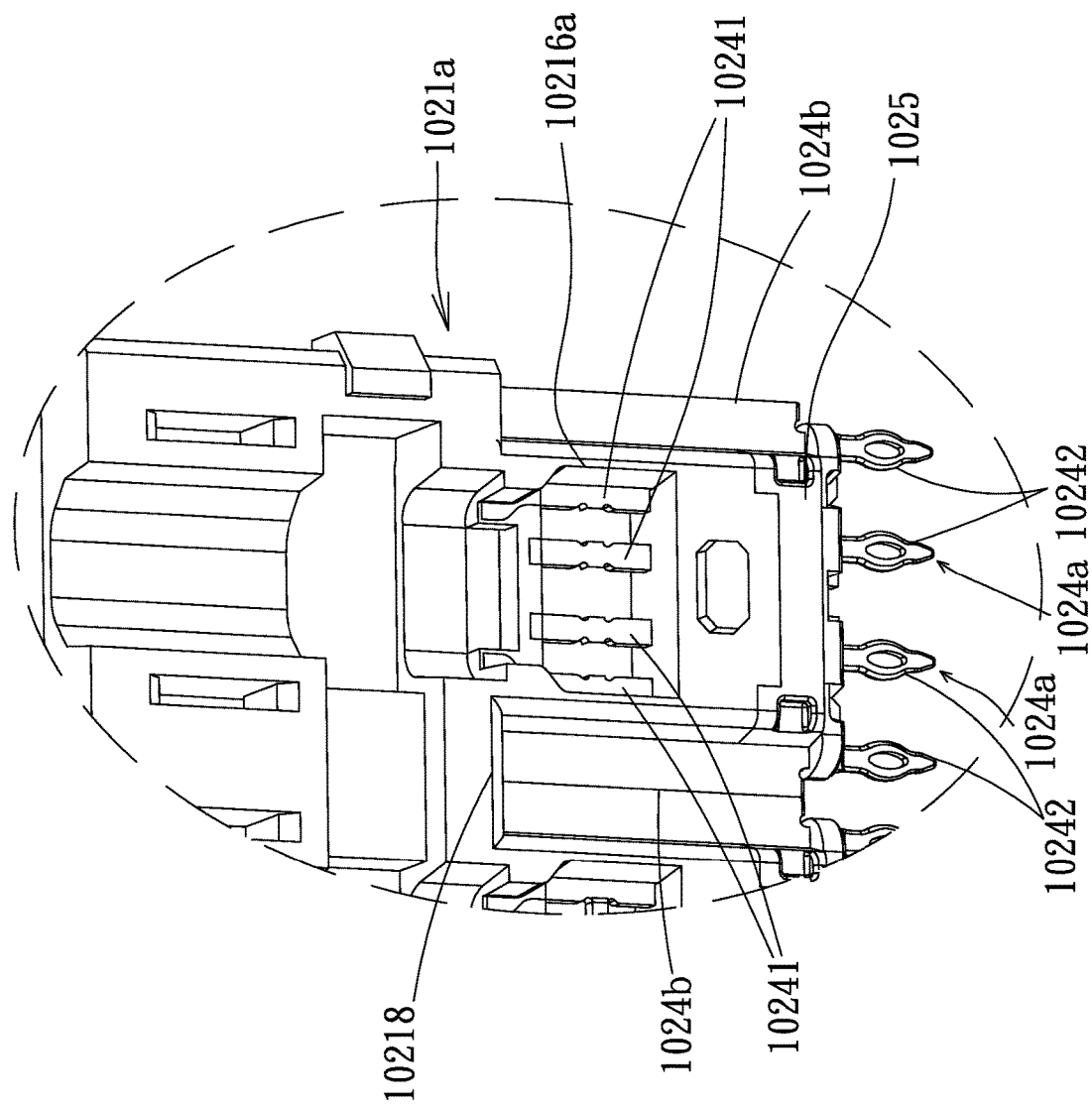
FIG. 14 is an enlarged view of area A of FIG. 11.

FIG. 13 is a schematic diagram of the connection between the terminal group and the cable of the first embodiment of the present disclosure. FIG. 14 is an enlarged view of area A of FIG. 11. As shown in the figure, each of the terminal groups 1024 of this embodiment comprises four terminals disposed at intervals. The four terminals comprise two signal terminals 1024a and two ground terminals 1024b. The two signal terminals 1024a are disposed between the two ground terminals 1024b. Each of the signal terminals 1024a comprises a contacting part 10241 and an electrical connecting part 10242. The two contacting parts 10241 of the two signal terminals 1024a are disposed in the first limiting part 10216a and are exposed from the first limiting part 10216a. The two electrical connecting parts 10242 of the two signal terminals 1024a are disposed below the first insulator 1021a. Each of the ground terminals 1024b comprises a contacting part 10241 and an electrical connecting part 10242. The two contacting parts 10241 of the two ground terminals 1024b are disposed in the first limiting part 10216a and exposed from the first limiting part 10216a. The two electrical connecting parts 10242 of the two ground terminals 1024b are disposed below the first insulator 1021a. A part of each of the ground terminals 1024b is disposed in an adjacent embedding opening 10218, and each of the embedding openings 10218 comprises two ground terminals 1024b of two adjacent terminal groups 1024. Thus, in this embodiment, the width of the contacting part 10241 of the signal terminal 1024a is narrower than the width of the contacting part 10241 of the ground terminal 1024b. Besides, in this embodiment, the distance between the two electrical connecting parts 10242 of the two signal terminals 1024a is different from the distance between the two contacting parts 10241 of the two signal terminals 1024a. In this embodiment, the distance between the two electrical connecting parts 10242 of the two signal terminals 1024a is greater than the distance between the two contacting parts 10241 of the two signal terminals 1024a. In this way, the plurality of distances between the two electrical connecting parts 10242 of the two signal terminals 1024a and the two electrical connecting parts 10242 of the two ground terminals 1024b are identical, facilitating the manufacture of the circuit board.

Figure 15:
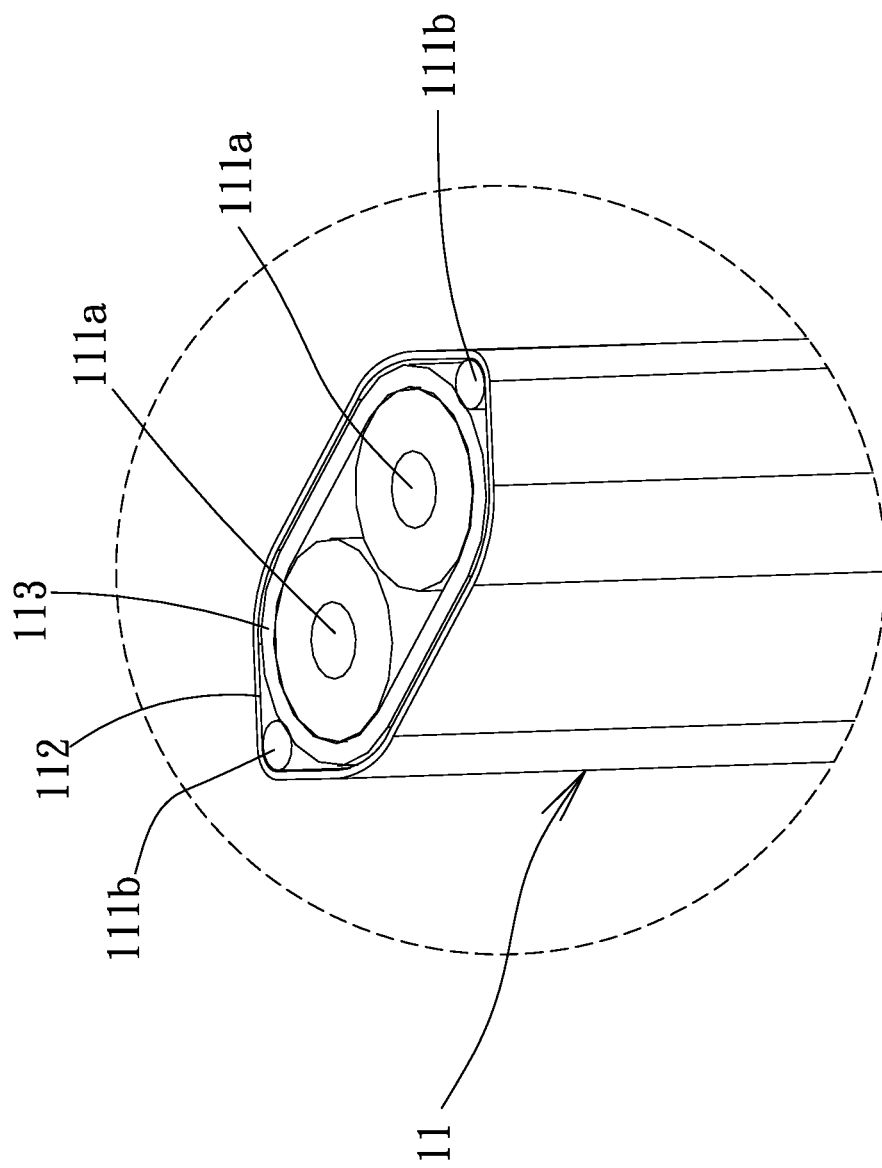
FIG. 15 is an enlarged view of area B of FIG. 9.

The second insulator 1021b further comprises a plurality of second limiting parts 10216b, a plurality of first positioning grooves 10220a, and a plurality of second positioning grooves 10220b. Each of the second limiting parts 10216b is disposed on a surface of the second insulator 1021b close to the first insulator 1021a along the second direction Y, and corresponds to the plurality of second accommodating grooves 10212b. Each of the second limiting parts 10216b is disposed below the corresponding second accommodating groove 10212b. In this embodiment, the second limiting part 10216b is a bump. The plurality of first positioning grooves 10220a are disposed on a surface of the second insulator 1021b close to the first insulator 1021a along the second direction Y. The plurality of second positioning grooves 10220b are disposed on a surface of the second insulator 1021b away from the first insulator 1021a along the second direction Y. The plurality of second positioning grooves 10220b are respectively disposed opposite to the plurality of first positioning grooves 10220a. The first positioning groove 10220a and second positioning groove 10220b opposite to the first positioning groove 10220a are disposed between the second accommodating groove 10212b and the second limiting part 10216b corresponding to the second accommodating groove 10212b. Refer to FIG. 13 and FIG. 15, an enlarged view of area B of FIG. 9, as shown in the figures, the details of the connection between each of the terminal groups 1024 and cable 11 is described as follows. Each of the cables 11 comprises a plurality of wires. The plurality of wires are respectively connected to the terminals of the corresponding terminal group 1024. In this embodiment, the plurality of wires comprises a pair of signal wires 111a and two ground wires 111b. When the second insulator 1021b is installed on the first insulator 1021a, the pair of signal wires 111a of each of the cables 11 are respectively connected to the two signal terminals 1024a in the corresponding first limiting part 10216a. Practically, each of the signal wires 111a is connected to the corresponding signal terminal 1024a by soldering. The signal wires 111a of this embodiment are differential signal wires, one of the two signal wires 111a is used to transmit positive signals, and the other is used to transmit negative signals. The signal transmitted by the pair of signal wires 111a is a differential signal, which is transmitted by the signal terminal 1024a connected to the signal wire 111a. The two ground wires 111b of each of the cables 11 are respectively connected to the two ground terminals 1024b in the corresponding first limiting part 10216a so that the ground terminals 1024b can be grounded. Each of the cables 11 of this embodiment further comprises an insulating covering part 112 and an insulating layer 113. The pair of signal wires 111a and two ground wires 111b are disposed side by side in the insulating covering part 112 inside the cable 11. The two ground wires 111b are respectively disposed on two sides of the pair of signal wires 111a. The insulating layer 113 covers the pair of signal wires 111a and is disposed between the ground wire 111b and the corresponding signal wires 111a.

The second cover 1023 further comprises a plurality of second positioning parts 10231 and a plurality of second securing holes 10232. The plurality of second positioning parts 10231 are disposed along the second direction Y and protrude from a surface of the second cover 1023 close to the second insulator 1021b. The plurality of second securing holes 10232 respectively correspond to the plurality of second positioning parts 10231. Each of the second securing holes 10232 is disposed below the corresponding second positioning part 10231. Two sides of the second cover 1023 are further provided with engaging openings 10233 respectively.

During assembling, when the first cover 1022 is installed onto the first insulator 1021a, which is, two tenons 10221a of each of the tenon components 10221 can be correspondingly tenoned into the two engaging holes 10213a of the corresponding engaging part 10213. So, the first insulator 1021a can be installed on the first cover 1022. The plurality of first securing blocks 10214 of the first insulator 1021a and the plurality of first securing holes 10222 are structurally and positionally matched. The plurality of first securing blocks 10214 are correspondingly engaged with the plurality of first securing holes 10222. In this way, the assembly of the first cover 1022 and the first insulator 1021a can be more stable through the engagement of matched securing.

Next, the second insulator 1021b is installed onto the first insulator 1021a. Practically, the plurality of second limiting parts 10216b of the second insulator 1021b is correspondingly engaged into the plurality of first limiting parts 10216a, and each of the positioning parts 10223 passes through the corresponding through hole 10217 of the first insulator 1021a and passes through the plurality of first positioning grooves 10220a of the second insulator 1021b.

In this way, the second insulator 1021*b* can be installed on the first insulator 1021*a*. When the second insulator 1021*b* is installed on the first insulator 1021*a*, each of the first accommodating grooves 10212*a* and each of the second accommodating grooves 10212*b* would form an accommodating groove presenting an annular wall, which can cover a part of the cable 11. In some embodiments, the second insulator 1021*b* is formed on the first insulator 1021*a* by injection molding, and they could cover the cable 11 together.

Then, the second cover 1023 is installed on the second insulator 1021*b*. Each of the second positioning parts 10231 of the second cover 1023 is correspondingly engaged with each of the second positioning grooves 10220*b*. In this way, the overall assembly can be more stable and accurately positioned. Particularly, since the plurality of first limiting parts 10216*a* of the first insulator 1021*a* are respectively disposed above the corresponding second securing block 10215, the plurality of second securing blocks 10215 would be exposed when the plurality of second limiting parts 10216*b* of the second insulator 1021*b* are correspondingly engaged with the plurality of first limiting parts 10216*a*. Thus, when the second cover 1023 is finally assembled, each of the second securing blocks 10215 of the first insulator 1021*a* would be correspondingly engaged in each of the second securing holes 10232 of the second cover 1023. Besides, the two engaging openings 10233 on two sides of the second cover 1023 are respectively engaged with the two engaging blocks 10219 on two sides of the first insulator 1021*a* to allow each of the engaging blocks 10219 to pass through and secured to each of the engaging openings 10233. In this way, the second insulator 1021*b* can be secured between the first insulator 1021*a* and the second cover 1023, thereby improving the stability. Finally, the bonding of the first cover 1022 and the second cover 1023 can be spot soldering or other bonding methods to increase the overall connecting stability. The first cover 1022 and the second cover 1023 are designed as lead angle type to ensure reliable mechanical and electrical connection, thereby reducing mechanical stress for each of the cables 11 and each of the terminal groups 1024. The lead-in and polarization of the lead angle could prevent contacting damage and to provide a reliable connection.

In some embodiments, the first insulator 1021*a* is formed to secure the terminal group 1024, and then the cable 11 is disposed on the first insulator 1021*a* and is connected to the terminal group 1024. Next, the second insulator 1021*b* is formed on the first insulator 1021*a* and covers the cable 11 and the terminal group 1024. Then, the first cover 1022 and the second cover 1023 are installed on the first insulator 1021*a* and the second insulator 1021*b* respectively.

In this embodiment, a surface of the first cover 1022 close to the first insulator 1021*a* further comprises a plurality of first contacting parts 10226 disposed along the second direction Y. Each of first contacting parts 10226 is disposed between two adjacent tenon components 10221 and is disposed below the corresponding opening 10224. A surface of the second cover 1023 close to the second insulator 1021*b* further comprises a plurality of second contacting parts 10234 disposed along the second direction Y. Each of the second contacting parts 10234 is disposed between two adjacent second securing holes 10232. In this embodiment, the material of the first cover 1022 and the second cover 1023 is conductive, such as metal, conductive plastic, electroplated plastic. When the first cover 1022 is installed on the first insulator 1021*a*, the plurality of first contacting parts 10226 respectively enter the corresponding embedding openings 10218. Each of the first contacting parts 10226 is in contact with two ground terminals 1024*b* in the corresponding embedding opening 10218, so that the first cover 1022 would be in contact with the ground terminal 1024*b* to be grounded. When the second cover 1023 is installed to the first cover 1022, the plurality of second contact parts 10234 respectively pass through the second insulator 1021*b* and enter the corresponding embedding opening 10218. Each of the second contacting parts 10234 is in contact with two ground terminals 1024*b* in the corresponding embedding opening 10218 so that the second cover 1023 would be in contact with the ground terminal 1024*b* to be grounded. The grounding of the first cover 1022 and the second cover 1023 can protect the signal generated by the terminal module 102 from being electromagnetically interfered by other terminal modules 102, and keep the electromagnetics generated by the terminal module 102 to interfere with other terminal modules 102. In this way, the signal transmission performance of each of the terminal modules 102 can be effectively improved, thereby improving the overall signal transmission performance.

Figure 16:
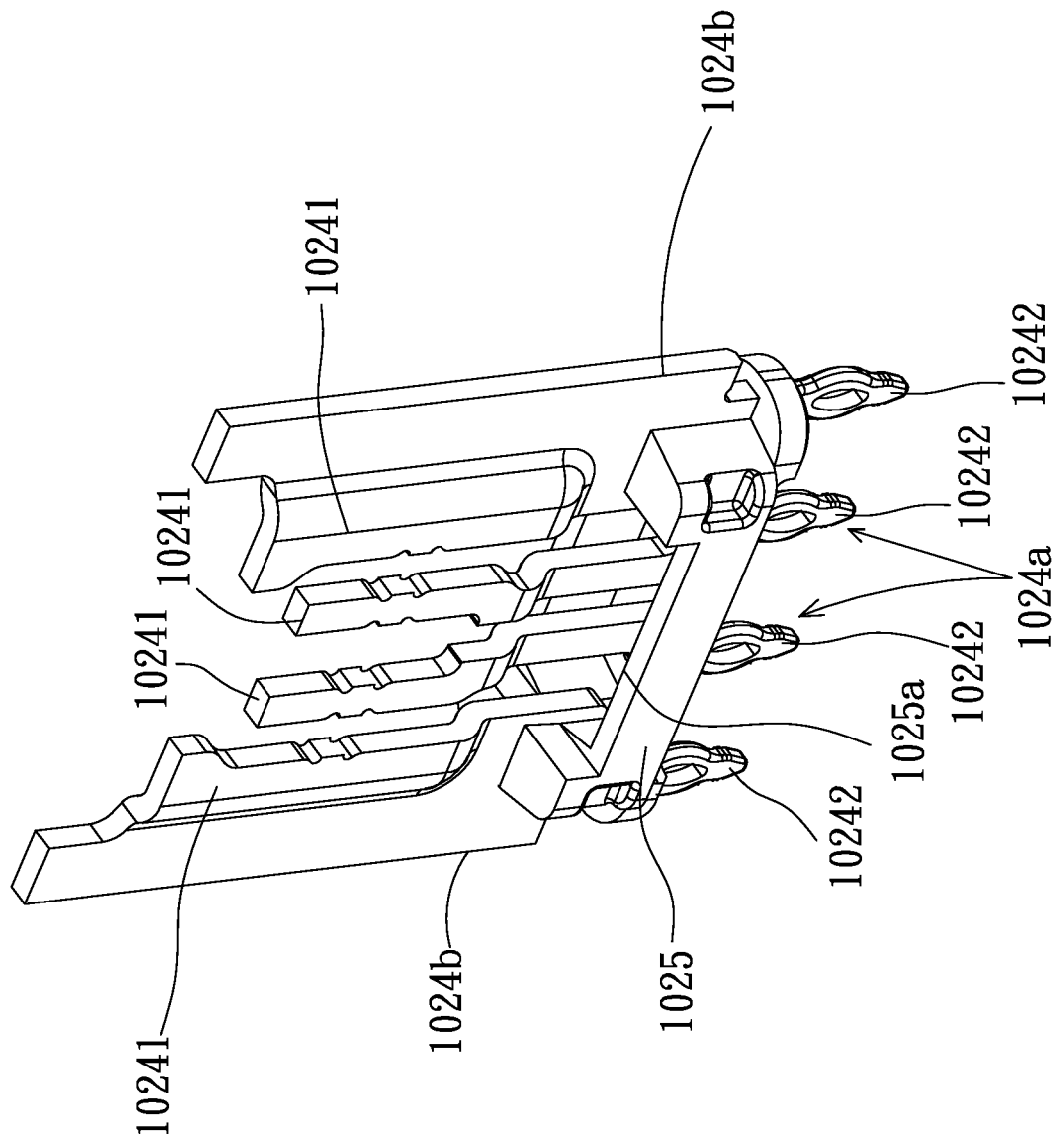
FIG. 16 is a schematic diagram of the terminal base assembled with terminals of the first embodiment of the present disclosure.

FIG. 16 is a schematic diagram of the terminal base assembled with terminals of the first embodiment of the present disclosure. As shown in the figure, each of the terminal modules 102 of this embodiment further comprises a plurality of terminal bases 1025. The plurality of terminal bases 1025 are disposed at the bottom of the first insulator 1021*a* along the second direction Y, and are disposed on the corresponding terminal group 1024. Each of the terminal bases 1025 comprises at least one through hole 1025*a*. In this embodiment, the number of through holes 1025*a* is one. Two electrical connecting parts 10242 of the two signal terminals 1024*a* of each of the terminal groups 1024 pass through the first through hole 1025*a* and do not contact a sidewall of the through hole 1025*a*. That is, a gap exists between the two electrical connecting parts 10242 of the two signal terminals 1024*a* of each of the terminal groups 1024 and the sidewall of the corresponding through hole 1025*a*. Two electrical connecting parts 10242 of the two ground terminals 1024*b* of each of the terminal groups 1024 pass through the terminal base 1025. The electrical connecting part 10242 of each of the ground terminals 1024*b* is in contact with the terminal base 1025. In this embodiment, the material of the terminal base 1025 is conductive, such as electroplated plastic, conductive plastic, or metal. The material for the terminal base 1025 would not be limited thereto, but only to make the terminal base 1025 conductive. Each of the terminal bases 1025 is in contact with two ground terminals 1024*b* of the corresponding terminal group 1024 to be grounded. Each of the terminal groups 1024 is provided with a terminal base 1025. Interfering between the plurality of terminal groups 1024 of one terminal module 102 can be avoided during signal transmission by the plurality of terminal bases 1025. In this way, the signal transmission performance of the terminal module 102 can be further improved, thereby improving the overall signal transmission performance. When the first cover 1022 and the second cover 1023 are installed on the sheet insulating body 1021, the first cover 1022 and the second cover 1023 are in contact with the terminal base 1025. This ensures that the first cover 1022 and the second cover 1023 can be grounded, thereby ensuring that the plurality of terminal modules 102 would not cross-interfere during the signal transmission process.

When the assembly of the terminal module 102 is completed, the plurality of terminal modules 102 would be installed in the housing 101. The plurality of elastic sheet groups 10225 of the first cover 1022 of each of the terminal modules 102 abut against the second cover 1023 of adjacent terminal module 102. In this way, it can be ensured that the plurality of first covers 1022 and the plurality of second covers 1023 of the plurality of terminal modules 102 of one wire-to-board connector are grounded, thereby ensuring that there would not be inference between the plurality of terminal modules 102 to improve the signal transmission performance of the cable connector 1 in the overall signal transmission process.

Figure 17:
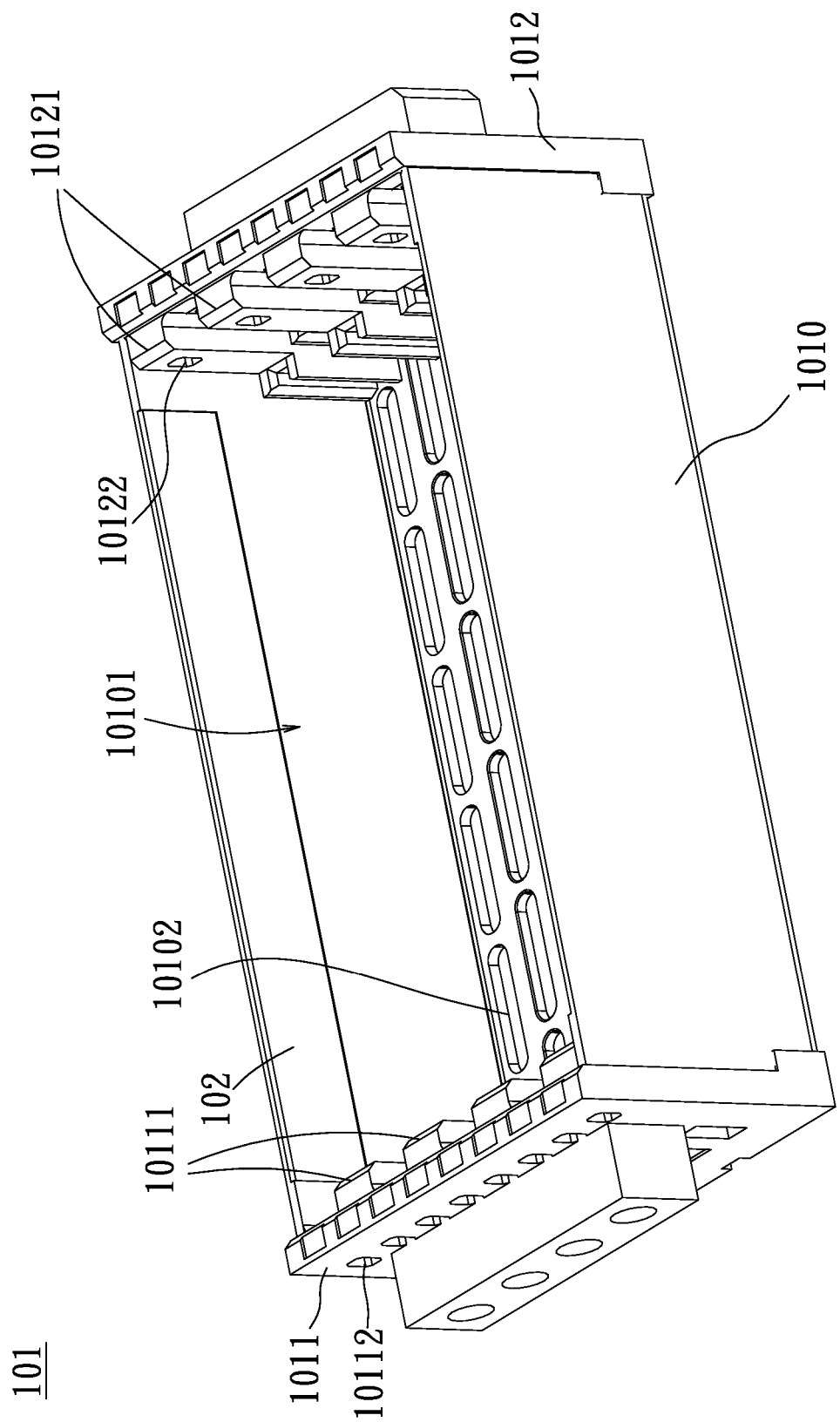
FIG. 17 is a perspective view of a housing of the first embodiment of the present disclosure.
Figure 18:
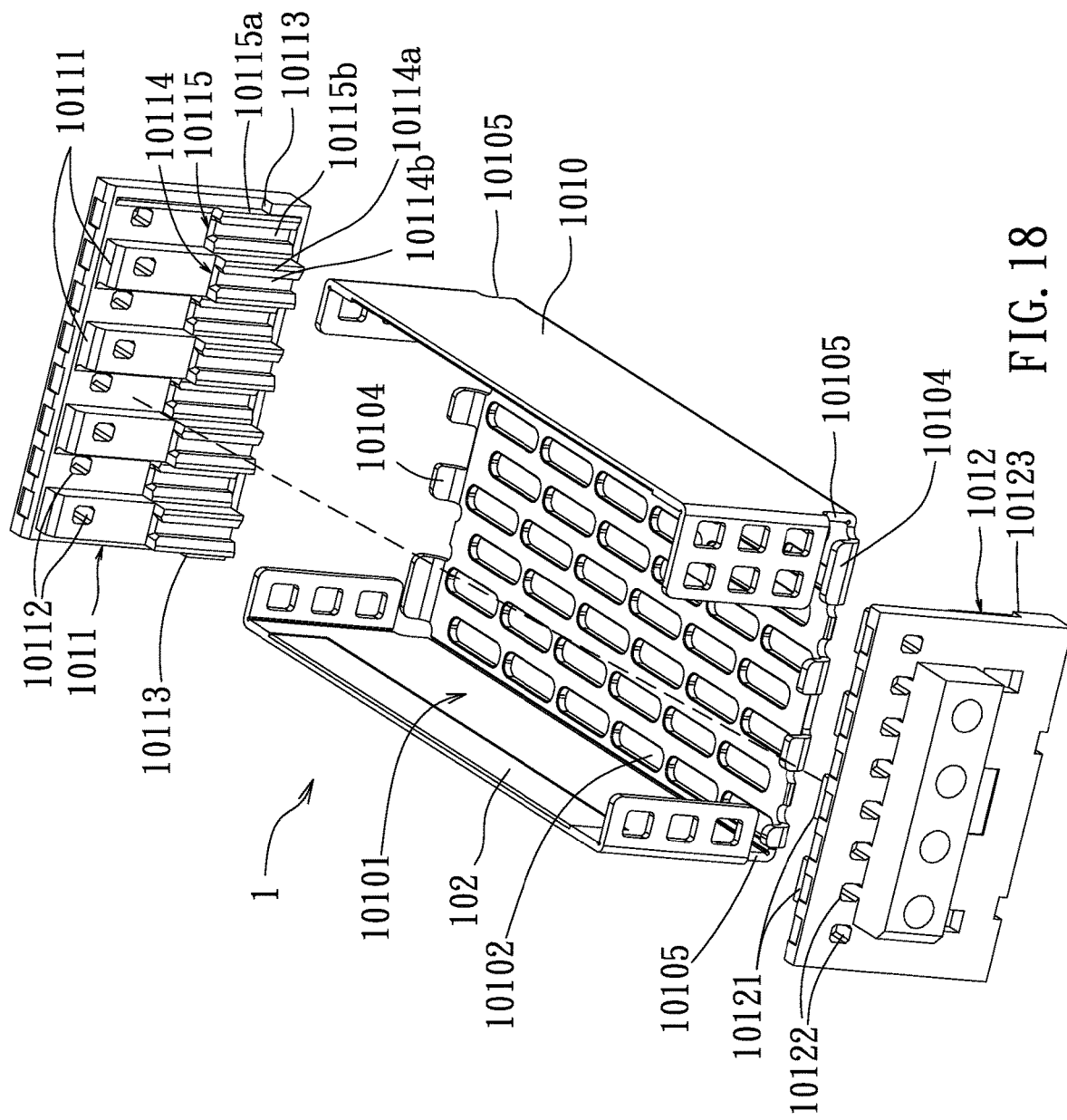
FIG. 18 is an exploded view of the housing of the first embodiment of the present disclosure.
Figure 19:
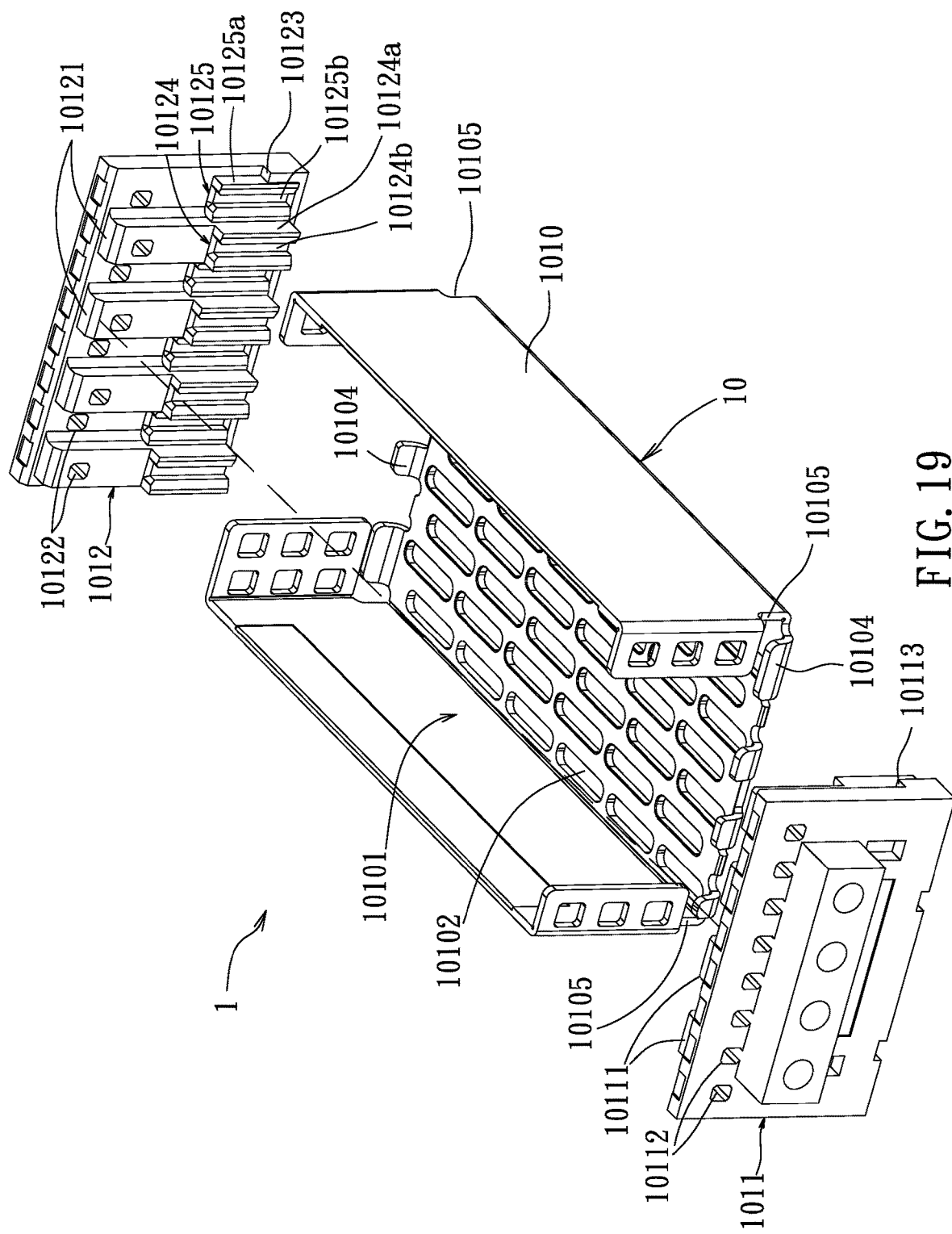
FIG. 19 is another exploded view of the housing of the first embodiment of the present disclosure.

In this embodiment, the structural configuration of the housing 101 of the first wire-to-board connector 10a is identical to the housing 101 of the second wire-to-board connector 10b, so the housing 101 of the first wire-to-board connector 10a would be described in the follows. The housing 101 of this embodiment, having good structural strength, assembly efficiency, and assembly variability, can improve the concern of the unity of assembly variation of the housing of the conventional wire-to-board connectors. FIG. 17 to FIG. 19 are perspective view and exploded views of the first embodiment of the present disclosure. As shown in the figure, the housing 101 of this embodiment further comprises a first end cover 1011 and a second end cover 1012. The first end cover 1011 is disposed on one end of the main body 1010, and the second end cover 1012 is disposed on the other end of the main body 1010. The second end cover 1012 is opposite to the first end cover 1011 with the main body 1010 in between. The first end cover 1011 further comprises a plurality of first partition parts 10111 disposed at intervals, and the second end cover 1012 comprises a plurality of second partition parts 10121 disposed at intervals. The plurality of first partition parts 10111 and the plurality of second partition parts 10121 are alternately disposed. That is, each of the first partition parts 10111 is disposed between two adjacent second partition parts 10121, and each of the second partition parts 10121 is disposed between two adjacent first partition parts 10111. In this embodiment, the structural configuration of the first end cover 1011 is identical to that of the second end cover 1012, and the structural configuration of the plurality of first partition parts 10111 is identical to that of the plurality of second partition parts 10121. In this embodiment, the positions where the plurality of first partition parts 10111 are disposed on the first end cover 1011 are different from the positions where the plurality of second partition parts 10121 are disposed on the second end cover 1012. Each of the first partition parts 10111 and each of the second partition parts 10121 would not be positioned correspondingly at all events, even, such as displacing the plurality of first partition parts 10111 by the width of one partition part at the same time, or displacing the plurality of second partition parts 10121 by the width of one partition part at the same time. Thus, when the first end cover 1011 and the second end cover 1012 are installed on the main body 1010, the plurality of first partition parts 10111 of the first end cover 1011 and the plurality of second partition parts 10121 of the second end cover 1012 would be alternately arranged.

In one embodiment, two end edges of the main body 1010 respectively have a plurality of buckles 10104 and two first engaging parts 10105 disposed at intervals. The plurality of buckles 10104 are disposed on an end edge of the bottom of the accommodating groove 10101 of the main body 1010. The two first engaging parts 10105 are respectively disposed on the two sidewalls of the accommodating groove 10101 and are close to the bottom of the accommodating groove 10101. In one embodiment, the first end cover 1011 further comprises a plurality of first openings 10112 and two second engaging parts 10113. The plurality of first openings 10112 are disposed in parallel on the plurality of first partition parts 10111 of the first end cover 1011 and are disposed in a plurality of gaps, each of which is between two adjacent first partition parts 10111. The plurality of first openings 10112 penetrate the first end cover 1011 along the first direction X. The two second engaging parts 10113 are respectively disposed on two sides of the first end cover 1011. The first end cover 1011 further comprises a plurality of first embedding parts 10114 and a plurality of second embedding parts 10115. The plurality of first embedding parts 10114 are respectively disposed on the corresponding first partition part 10111, and each of the second embedding parts 10115 is disposed between two adjacent first partition parts 10111. In detail, each of the first embedding parts 10114 comprises two first sidewalls 10114a disposed at intervals and a first embedding groove 10114b disposed between the two first sidewalls 10114a. The two first sidewalls 10114a perpendicularly extend in a direction closing to the accommodating groove 10101 and protrude from a surface of the first end cover 1011 close to the main body 1010. Similarly, the second embedding part 10115 comprises two second sidewalls 10115a disposed at intervals and a second embedding groove 10115b disposed between the two second sidewalls 10115a. The two second sidewalls 10115a of the second embedding part 10115 are respectively adjacent to side surfaces of the corresponding first partition part 10111.

The second end cover 1012 comprises a plurality of second openings 10122 and two third engaging parts 10123. The plurality of second openings 10122 are disposed in parallel on the plurality of second partition parts 10121 of the second end cover 1012 and are disposed in a plurality of gaps, each of which is between two adjacent second partition parts 10121. The plurality of second openings 10122 penetrate the second end cover 1012 along the first direction X. The two third engaging parts 10123 are respectively disposed on two sides of the second end cover 1012. The second end cover 1012 further comprises a plurality of first embedding parts 10124 and a plurality of second embedding parts 10125. The plurality of first embedding parts 10124 are respectively disposed on the corresponding second partition part 10121, and each of the second embedding parts 10125 is disposed between two adjacent second partition parts 10121. In detail, the structural configuration of the first embedding part 10124 and the second embedding part 10125 of the second end cover 1012 is identical to that of the first embedding part 10114 and the second embedding part 10115 of the first end cover 1011. The first embedding parts 10124 of the second end cover 1012 comprises two first sidewalls 10124a disposed at intervals and a first embedding groove 10124b disposed between the two first sidewalls 10114a. The two first sidewalls 10124a perpendicularly extend in a direction closing to the accommodating groove 10101, and protrude from a surface of the second end cover 1012 close to the main body 1010. The second embedding part 10115 of the second end cover 1012 comprises two second sidewalls 10125a disposed at intervals and a second embedding groove 10125b disposed between the two second sidewalls 10125a. The two second sidewalls 10125a are respectively adjacent to side surfaces of the corresponding second partition part 10121.

When the first end cover 1011 and the second end cover 1012 are installed to the main body 1010, the plurality of first embedding parts 10114 of the first end cover 1011 and the plurality of second embedding parts 10125 of the second end cover 1012 are in one-to-one correspondence, and the plurality of second embedding parts 10115 of the first end cover 1011 and the plurality of first embedding parts 10124 of the second end cover 1012 are in one-to-one correspondence. The plurality of buckles 10104 of the main body 1010 are correspondingly engaged and secured to the bottoms of the plurality of second embedding grooves 10115b of the plurality of second embedding parts 10115 of the first end cover 1011 and the plurality of second embedding grooves 10125b of the plurality of second embedding parts 10125 of the second end cover 1012. Besides, the structural configurations and positions of each of the first engaging parts 10105 close to the first end cover 1011 matches with those of the second engaging part 10113 of the first end cover 1011, and the structural configurations and positions of each of the first engaging parts 10105 close to the second end cover 1012 matches with those of the third engaging part 10123 of the second end cover 1012. For example, the first engaging part 10105 is a stepped-shaped groove, and the second engaging part 10113 and the third engaging part 10123 are stepped-shaped bumps. The second engaging part 10113 and the third engaging part 10123 are respectively engaged with and secured to the corresponding first engaging parts 10105. In this way, the first end cover 1011 and the second end cover 1012 can be disposed on the main body 1010. In one embodiment, the bottom surfaces of the first end cover 1011 and the second end cover 1012, and the bottom surface of the main body 1010 are coplanar. So, they can be stably disposed on the circuit board. In addition to the above engaged-securing method to assemble the main body 1010, the first end cover 1011 and the second end cover 1012, the main body 1010, the first end cover 1011 and the second end cover 1012 can also be integrally formed into one piece.

Back to FIG. 3, FIG. 8 to FIG. 11, the housing 101 accommodates at least one terminal module 102. Two sides of the first cover 1022 of the terminal module 102 are provided with a first embedding bump 10227 respectively. Two sides of the second cover 1023 of the terminal module 102 are further provided with a hook 10235 and a second embedding bump 10236 respectively. The hook 10235 is disposed above the second embedding bump 10236. The two first embedding bumps 10227 respectively correspond to the two second embedding bumps 10236. When the terminal module 102 is disposed in the accommodating groove 10101 of the main body 1010, two sides of each of the terminal modules 102 are respectively disposed on the first partition part 10111 and in a gap between two adjacent second partition parts 10121 or are respectively disposed on the second partition part 10121 and in the gap between two adjacent first partition parts 10111. When two ends of the terminal module 102 are respectively disposed on the first partition part 10111 and in the gap between two adjacent second partition parts 10121, the two hooks 10235 of the terminal module 102 are respectively engaged with the first opening 10112 of the first partition part 10111 and the second opening 10122 between two adjacent second partition parts 10121. The first embedding bump 10227 and the second embedding bump 10236 of each of the terminal modules 102 close to the first end cover 1011 are disposed in the first embedding groove 10114b of the first embedding part 10114 of the first end cover 1011. The first embedding bump 10227 and the second embedding bump 10236 of each of the terminal modules 102 close to the second end cover 1012 are disposed in the second embedding groove 10125b of the second embedding part 10125 of the second end cover 1012. When two sides of the terminal module 102 are respectively disposed on the second partition part 10121 and in the gap between two adjacent first partition parts 10111, the two hooks 10235 of the terminal module 102 are respectively engaged in the second opening 10122 of the second partition part 10121 and in the first opening 10112 between two adjacent first partition parts 10111. The first embedding bump 10227 and the second embedding bump 10236 of each of the terminal modules 102 close to the first end cover 1011 are disposed in the second embedding groove 10115b of the second embedding part 10115 of the first end cover 1011. The first embedding bump 10227 and the second embedding bump 10236 of each of the terminal modules 102 close to the second end cover 1012 are disposed in the first embedding groove 10124b of the first embedding part 10125 of the second end cover 1012. In this way, the plurality of terminal modules 102 can be stably disposed in the corresponding housing 101. As the plurality of first partition parts 10111 of the first end cover 1011 and the plurality of second partition parts 10121 of the second end cover 1012 are alternately disposed, after installation according to the above assembly method and so on, the plurality of terminal modules 102 can be alternately disposed in the accommodating groove 10101. In this way, the plurality of terminal groups 1024 of each of the terminal modules 102 and the plurality of terminal groups 1024 of adjacent terminal modules 102 can be disposed alternately. Meanwhile, each of the cables 11 is connected to the corresponding terminal group 1024, allowing the plurality of cables 11 on each of the terminal modules 102 and the plurality of cables 11 on the adjacent terminal module 102 to be alternately disposed. This design helps the connectors to avoid signal crosstalk and effectively improve the signal transmission performance of the cable connector 1 during signal transmission process. The two first embedding bumps 10227 of the first cover 1022 and the two second embedding bumps 10236 of the second cover 1023 respectively contact with the corresponding ground terminals 1024b, allowing the plurality of terminal groups 1024 in each of the terminal modules 102 to be completely protected by grounded first cover 1022 and the second cover 1023 to prevent the signal transmitted by the plurality of terminal groups 1024 from being interfered. Thus, each of the terminal modules 102 could have excellent signal transmission performance during the signal transmission process, allowing the cable connector 1 to perform excellent signal transmission.

Figure 20:
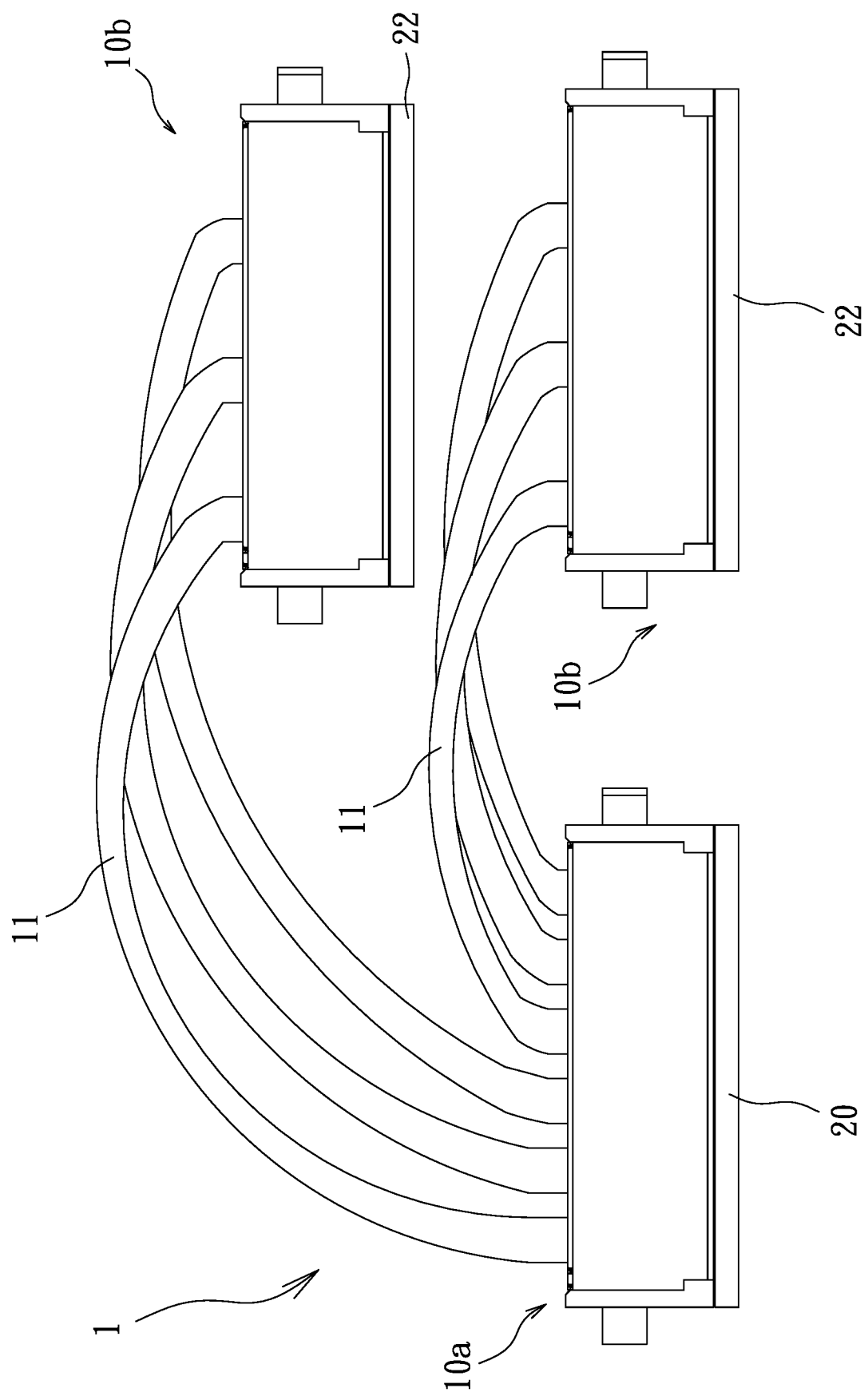
FIG. 20 is a schematic diagram of a cable connector of the second embodiment of the present disclosure.

FIG. 20 is a schematic diagram of a cable connector of the second embodiment of the present disclosure. As shown in the figure, the cable connector 1 of this embodiment is different from the cable connector of the first embodiment in that the number of second wire-to-board connectors 10b of the cable connector 1 is two, one of which is connected with one end of the plurality of cables 11 and the plurality of terminal modules 102 of the first wire-to-board connector 10a, and the other one is connected with the other end of the plurality of cables 11 and the plurality of terminal modules 102 of the two second wire-to-board connectors 10b, wherein the plurality of terminal modules 102 of the first wire-to-board connector 10a are inserted into the corresponding first circuit board 20, and the plurality of terminal modules 102 of each of the second wire-to-board connectors 10b are inserted into the corresponding second circuit board 22. When the plurality of cables 11 are 48 differential pair cables, the first wire-to-board connector 10a can be used as a connecting end for the 48 differential pair cables, and the two second wire-to-board connectors 10b can be the connecting ends of the 24 differential pair cables respectively. Particularly, the first wire-to-board connector 10a can respectively connect the output signal differential pair to one or more second wire-to-board connectors 10. The first wire-to-board connector 10a could form 48 differential pairs through the plurality of cables 11, and with the mutual corresponding connection of the plurality of cables 11, the first circuit board 20 can be directly and electrically connected to the two second circuit boards 22 respectively. The number of cables 11 can also be adjusted appropriately depending on actual applications, and it is not limited thereto. The number of second wire-to-board connectors 10b can also be adjusted appropriately according to requirements, and variously formed and configured wire-to-board connectors can be interactingly matched, and then the plurality of circuit boards can be electrically connected directly, having the connectors to be competitive in the related industries.

In summary, the present disclosure proposed a terminal module to solve the problem of insufficient structural strength and poor transmission performance of components comprising housing, cable end terminals, and insulators. Through the present disclosure, the plurality of terminal groups are disposed on the first insulator having insulating properties and disposed at intervals, the plurality of cables are disposed on the second insulator having insulating properties and disposed at intervals, each of the cables and the plurality of terminals electrically connected thereto can be isolated to form an independent space respectively. Therefore, first insulator and the second insulator can be disposed between the first cover and the second cover to optimize the performance of the terminal module.

It is to be understood that the term "comprises", "comprising", or any other variants thereof, is intended to encompass a non-exclusive inclusion, such that a process, method, article, or device of a series of elements not only include those elements but also comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A terminal module, comprising:
   a first cover;
   a first insulator installed on the first cover, comprising a plurality of terminal bases and a plurality of first accommodating grooves, the plurality of terminal bases being disposed at the bottom of the first insulator, a terminal group being disposed in each of the terminal bases;
   a second insulator disposed on the first insulator, comprising a plurality of second accommodating grooves, the plurality of second accommodating grooves corresponding to the plurality of first accommodating grooves, each of the first accommodating grooves and the corresponding second accommodating groove accommodating a cable collectively, the cable being electrically connected to the corresponding terminal group; and
   a second cover installed on the first insulator, so that the first insulator and the second insulator being disposed between the first cover and the second cover.

2. The terminal module according to claim 1, wherein the plurality of first accommodating grooves match with the plurality of second accommodating grooves; an accommodating groove having an annular wall is formed when the plurality of second accommodating grooves are installed corresponding to the positions of the plurality of first accommodating grooves.

3. The terminal module according to claim 1, wherein the first cover comprises a plurality of tenon components; the first insulator comprises a plurality of engaging parts; each of the tenon components is disposed on the corresponding engaging part; each of the tenon components comprises two tenons symmetrically arranged; each of the engaging parts comprises two engaging holes symmetrically arranged; the two engaging holes are disposed on two sides of the corresponding first accommodating groove; the two tenon components are respectively inserted into the corresponding engaging holes.

4. The terminal module according to claim 1, wherein the first cover further comprises a plurality of first securing holes; the first insulator further comprises a plurality of first securing blocks; the plurality of first securing blocks are disposed on a surface of the first insulator close to the first cover; the plurality of first securing blocks are respectively disposed in the corresponding first securing holes.

5. The terminal module according to claim 4, wherein the first insulator further comprises a plurality of second securing blocks and a plurality of first limiting parts; the plurality of second securing blocks are disposed on a surface of the first insulator away from the first cover; the plurality of second securing blocks are respectively opposite to the plurality of first securing blocks; the second insulator further comprises a plurality of second limiting parts disposed t at the corresponding first limiting parts respectively.

6. The terminal module according to claim 4, wherein the first cover plate further comprises a plurality of first positioning parts; the second cover further comprises a plurality of second positioning parts and a plurality of second securing holes; the second insulator comprises a plurality of first positioning grooves and a plurality of second positioning grooves; the plurality of first positioning grooves are disposed on a surface of the second insulator close to the first insulator; the plurality of second positioning grooves are disposed on a surface of the second insulator close to the second cover along a second direction; the plurality of first positioning parts are respectively disposed in the corresponding first positioning grooves; the plurality of second positioning parts are respectively disposed in the corresponding second positioning grooves.

7. The terminal module according to claim 1, wherein two sides of the second cover plate are provided with an engaging opening; two sides of the first insulator are respectively provided with a block; each of the blocks is disposed in the corresponding engaging opening.

8. The terminal module according to claim 1, wherein the first cover plate further comprises a plurality of elastic pieces abutting against the adjacent second cover.

9. The terminal module according to claim 1, wherein the plurality of terminal bases are conductive; the number of the terminals of each of the terminal groups is four; the terminal base is provided with a through hole; two of the four terminals are inserted into the corresponding through holes of the terminal base without contacting the terminal base; the other two of the four terminals are inserted into the corresponding terminal base, and forms an electrical connection with the terminal base by contacting with the terminal base.

10. The terminal module according to claim 9, wherein the cable further comprises a pair of signal wires and two ground wires; the pair of signal wires are electrically connected to the two terminals inserted in the through holes of the terminal base; the two ground wires are electrically connected to the other two terminals inserted in the terminal base.

11. The terminal module according to claim 1, wherein the first cover and the second cover is made of metal.

* * * * *